(12) United States Patent
Boysel et al.

(10) Patent No.: US 9,309,106 B2
(45) Date of Patent: Apr. 12, 2016

(54) 3D MEMS DEVICE AND METHOD OF MANUFACTURING

(71) Applicant: Motion Engine Inc., Montreal (CA)

(72) Inventors: Robert Mark Boysel, Montreal (CA); Louis Ross, Montreal (CA)

(73) Assignee: Motion Engine Inc., Montreal (CA)

( * ) Notice: Subject to any disclaimer, the term of this patent is extended or adjusted under 35 U.S.C. 154(b) by 0 days.

(21) Appl. No.: 14/622,619

(22) Filed: Feb. 13, 2015

(65) Prior Publication Data

US 2015/0191345 A1    Jul. 9, 2015

Related U.S. Application Data

(63) Continuation-in-part of application No. PCT/CA2014/050635, filed on Jul. 4, 2014.

(60) Provisional application No. 61/843,598, filed on Jul. 8, 2013.

(51) Int. Cl.
*H01L 27/14* (2006.01)
*H01L 29/84* (2006.01)
(Continued)

(52) U.S. Cl.
CPC ............. *B81B 7/007* (2013.01); *B81C 1/00301* (2013.01); *B81B 2207/095* (2013.01); *B81B 2207/096* (2013.01)

(58) Field of Classification Search
CPC ............ B81B 7/007; B81B 2201/0257; B81C 1/0031; B82Y 10/00; G01N 27/414; H01H 59/0009; G01P 15/0802; G01P 15/125; H04R 23/006; H01L 29/00
USPC ........ 257/414–418, 420, 686; 438/48–56, 67, 438/74
See application file for complete search history.

(56) References Cited

U.S. PATENT DOCUMENTS

| 4,430,895 A | 2/1984 | Colton |
| 4,483,194 A | 11/1984 | Rudolf |

(Continued)

FOREIGN PATENT DOCUMENTS

| WO | 2008086530 A2 | 7/2008 |
| WO | 2014122910 A1 | 8/2014 |

(Continued)

OTHER PUBLICATIONS

A Single-Proof-Mass MEMS Multi-Axis Motion Sensor by Dr. Mark Boysel, Semicon Japan 2008.
(Continued)

*Primary Examiner* — Hsien Ming Lee
(74) *Attorney, Agent, or Firm* — McCarter & English, LLP

(57) ABSTRACT

A MEMS device is provided. The device includes a MEMS wafer, a top cap wafer and a bottom cap wafer. The top and bottom cap wafers are respectively bonded to first and second sides of the MEMS wafer, the MEMS and cap wafers being electrically conductive. The outer side of the top cap wafer is provided with electrical contacts. The MEMS wafer, the top cap wafer and the bottom cap wafer define a cavity for housing a MEMS structure. The device includes insulated conducting pathways extending from within the bottom cap wafer, through the MEMS wafer and through the top cap wafer. The pathways are connected to the respective electrical contacts on the top cap wafer, for routing electrical signals from the bottom cap wafer to the electrical contacts on the top cap wafer. A method of manufacturing the MEMS device is also provided.

30 Claims, 13 Drawing Sheets

(51) Int. Cl.
*H01L 21/00* (2006.01)
*B81B 7/00* (2006.01)
*B81C 1/00* (2006.01)

(56) References Cited

U.S. PATENT DOCUMENTS

| | | |
|---|---|---|
| 4,553,436 A | 11/1985 | Hansson |
| 4,805,456 A | 2/1989 | Howe |
| 4,833,417 A | 5/1989 | Schroeder |
| 4,881,408 A | 11/1989 | Hulsing |
| 4,882,933 A | 11/1989 | Petersen |
| 4,905,523 A | 3/1990 | Okada |
| 4,967,605 A | 11/1990 | Okada |
| 5,359,893 A | 11/1994 | Dunn |
| 5,557,046 A | 9/1996 | Hulsing |
| 5,596,144 A | 1/1997 | Swanson |
| 5,614,742 A | 3/1997 | Gessner |
| 5,646,346 A | 7/1997 | Okada |
| 5,831,163 A | 11/1998 | Okada |
| 5,894,090 A | 4/1999 | Tang |
| 5,895,850 A | 4/1999 | Buestgens |
| 5,898,223 A | 4/1999 | Frye |
| 5,920,011 A | 7/1999 | Hulsing |
| 5,959,206 A | 9/1999 | Ryrko |
| 5,962,784 A | 10/1999 | Hulsing |
| 5,977,640 A | 11/1999 | Bertin |
| 5,987,985 A | 11/1999 | Okada |
| 6,003,371 A | 12/1999 | Okada |
| 6,028,773 A | 2/2000 | Hundt |
| 6,053,057 A | 4/2000 | Okada |
| 6,058,778 A | 5/2000 | Chan |
| 6,079,272 A | 6/2000 | Stell |
| 6,090,638 A | 7/2000 | Vigna |
| 6,091,132 A | 7/2000 | Bryant |
| 6,119,517 A | 9/2000 | Breng |
| 6,122,961 A | 9/2000 | Geen |
| 6,159,773 A | 12/2000 | Lin |
| 6,184,052 B1 | 2/2001 | Vigna |
| 6,225,699 B1 | 5/2001 | Ference |
| 6,235,550 B1 | 5/2001 | Chan |
| 6,257,057 B1 | 7/2001 | Hulsing |
| 6,282,956 B1 | 9/2001 | Okada |
| 6,295,870 B1 | 10/2001 | Hulsing |
| 6,391,673 B1 | 5/2002 | Ha |
| 6,399,997 B1 | 6/2002 | Lin |
| 6,469,330 B1 | 10/2002 | Vigna |
| 6,487,000 B2 | 11/2002 | Mastromatteo |
| 6,490,923 B1 | 12/2002 | Breng |
| 6,508,124 B1 | 1/2003 | Zerbini |
| 6,539,801 B1 | 4/2003 | Gutierrez |
| 6,584,845 B1 | 7/2003 | Gutierrez |
| 6,587,312 B2 | 7/2003 | Murari |
| 6,621,137 B1 | 9/2003 | Ma |
| 6,651,500 B2 | 11/2003 | Stewart |
| 6,675,630 B2 | 1/2004 | Challoner |
| 6,696,364 B2 | 2/2004 | Gelmi |
| 6,701,786 B2 | 3/2004 | Hulsing |
| 6,705,167 B2 | 3/2004 | Kvisteroey |
| 6,766,689 B2 | 7/2004 | Spinola Durante |
| 6,772,632 B2 | 8/2004 | Okada |
| 6,808,955 B2 | 10/2004 | Ma |
| 6,829,937 B2 | 12/2004 | Mahon |
| 6,841,861 B2 | 1/2005 | Brady |
| 6,856,144 B2 | 2/2005 | Lasalandra |
| 6,863,832 B1 | 3/2005 | Wiemer |
| 6,865,943 B2 | 3/2005 | Okada |
| 6,892,575 B2 | 5/2005 | Nasiri |
| 6,925,875 B2 | 8/2005 | Silverbrook |
| 6,939,473 B2 | 9/2005 | Nasiri |
| 6,942,750 B2 | 9/2005 | Chou |
| 6,944,931 B2 | 9/2005 | Shcheglov |
| 6,953,985 B2 | 10/2005 | Lin |
| 6,990,863 B2 | 1/2006 | Challoner |
| 6,991,957 B2 | 1/2006 | Eskridge |
| 6,993,617 B2 | 1/2006 | Butcher |
| 7,017,410 B2 | 3/2006 | Challoner |
| 7,040,163 B2 | 5/2006 | Shcheglov |
| 7,043,985 B2 | 5/2006 | Ayazi |
| 7,056,757 B2 | 6/2006 | Ayazi |
| 7,093,486 B2 | 8/2006 | Challoner |
| 7,100,448 B2 | 9/2006 | Ikegami |
| 7,104,129 B2 | 9/2006 | Nasiri |
| 7,138,694 B2 | 11/2006 | Nunan |
| 7,159,441 B2 | 1/2007 | Challoner |
| 7,168,318 B2 | 1/2007 | Challoner |
| 7,176,556 B2 | 2/2007 | Okamoto |
| 7,180,019 B1 | 2/2007 | Chiou |
| 7,210,351 B2 | 5/2007 | Lo |
| 7,217,588 B2 | 5/2007 | Hartzell |
| 7,238,999 B2 | 7/2007 | LaFond |
| 7,247,246 B2 | 7/2007 | Nasiri |
| 7,250,112 B2 | 7/2007 | Nasiri |
| 7,250,353 B2 | 7/2007 | Nasiri |
| 7,258,008 B2 | 8/2007 | Durante |
| 7,258,011 B2 | 8/2007 | Nasiri |
| 7,258,012 B2 | 8/2007 | Xie |
| 7,275,424 B2 | 10/2007 | Felton |
| 7,291,561 B2 | 11/2007 | Ma |
| 7,318,349 B2 | 1/2008 | Vaganov |
| 7,322,236 B2 | 1/2008 | Combi |
| 7,337,671 B2 | 3/2008 | Ayazi |
| 7,347,095 B2 | 3/2008 | Shcheglov |
| 7,360,423 B2 | 4/2008 | Ayazi |
| 7,417,329 B2 | 8/2008 | Chuang |
| 7,442,570 B2 | 10/2008 | Nasiri et al. |
| 7,458,263 B2 | 12/2008 | Nasiri |
| 7,484,410 B2 | 2/2009 | Tsuji |
| 7,491,567 B2 | 2/2009 | DCamp |
| 7,543,496 B2 | 6/2009 | Ayazi |
| 7,578,189 B1 | 8/2009 | Mehregany |
| 7,615,406 B2 | 11/2009 | Higashi |
| 7,621,183 B2 | 11/2009 | Seeger |
| 7,624,494 B2 | 12/2009 | Challoner |
| 7,642,657 B2 | 1/2010 | Suilleabhain |
| 7,677,099 B2 | 3/2010 | Nasiri |
| 7,694,563 B2 | 4/2010 | Durante |
| 7,748,272 B2 | 7/2010 | Kranz |
| 7,755,367 B2 | 7/2010 | Schoen |
| 7,784,344 B2 | 8/2010 | Pavelescu |
| 7,786,572 B2 | 8/2010 | Chen |
| 7,851,898 B2 | 12/2010 | Nakamura |
| 7,863,698 B2 | 1/2011 | Seeger |
| 7,875,942 B2 | 1/2011 | Cortese |
| 7,882,740 B2 | 2/2011 | Okada |
| 7,886,601 B2 | 2/2011 | Merassi |
| 7,898,043 B2 | 3/2011 | Ziglioli |
| 7,908,921 B2 | 3/2011 | Binda |
| 7,928,632 B2 | 4/2011 | Yang |
| 7,934,423 B2 | 5/2011 | Nasiri |
| 7,964,428 B2 | 6/2011 | Breng |
| 7,982,291 B2 | 7/2011 | Kuisma |
| 8,042,394 B2 | 10/2011 | Coronato |
| 8,047,075 B2 | 11/2011 | Nasiri |
| 8,049,515 B2 | 11/2011 | Schoen |
| 8,069,726 B2 | 12/2011 | Seeger |
| 8,071,398 B1 | 12/2011 | Yang |
| 8,080,869 B2 | 12/2011 | Okudo |
| 8,084,332 B2 | 12/2011 | Nasiri |
| 8,100,012 B2 | 1/2012 | Martin |
| 8,124,895 B2 | 2/2012 | Merassi |
| 8,134,214 B2 | 3/2012 | Baldo |
| 8,151,640 B1 | 4/2012 | Kubena |
| 8,176,782 B2 | 5/2012 | Furukubo |
| 8,227,285 B1 | 7/2012 | Yang |
| 8,227,911 B1 | 7/2012 | Yang |
| 8,236,577 B1 | 8/2012 | Hsu |
| 8,258,590 B2 | 9/2012 | Geiger |
| 8,272,266 B2 | 9/2012 | Zhang |
| 8,283,737 B2 | 10/2012 | Sugizaki |
| 8,289,092 B2 | 10/2012 | Pomarico |
| 8,314,483 B2 | 11/2012 | Lin |
| 8,324,047 B1 | 12/2012 | Yang |
| 8,347,717 B2 | 1/2013 | Seeger |
| 8,350,346 B1 | 1/2013 | Huang |

(56) References Cited

U.S. PATENT DOCUMENTS

| | | |
|---|---|---|
| 8,365,595 B2 | 2/2013 | Geiger |
| 8,375,789 B2 | 2/2013 | Prandi |
| 8,384,134 B2 | 2/2013 | Daneman |
| 8,395,252 B1 | 3/2013 | Yang |
| 8,395,381 B2 | 3/2013 | Lo |
| 8,402,666 B1 | 3/2013 | Hsu |
| 8,405,170 B2 | 3/2013 | Kohl |
| 8,407,905 B1 | 4/2013 | Hsu |
| 8,413,506 B2 | 4/2013 | Coronato |
| 8,421,082 B1 | 4/2013 | Yang |
| 8,426,961 B2 | 4/2013 | Shih |
| 8,432,005 B2 | 4/2013 | Yang |
| 8,433,084 B2 | 4/2013 | Conti |
| 8,459,093 B2 | 6/2013 | Donadel |
| 8,459,110 B2 | 6/2013 | Cazzaniga |
| 8,461,935 B2 | 6/2013 | McCraith |
| 8,481,365 B2 | 7/2013 | Verhelijden |
| 8,487,444 B2 | 7/2013 | Law |
| 8,490,461 B2 | 7/2013 | Sasaki |
| 8,508,039 B1 | 8/2013 | Nasiri |
| 8,508,045 B2 | 8/2013 | Khan |
| 8,519,537 B2 | 8/2013 | Jeng |
| 8,567,246 B2 | 10/2013 | Shaeffer |
| 8,569,090 B2 * | 10/2013 | Taheri ............... 438/51 |
| 8,637,943 B1 | 1/2014 | Yang |
| 8,652,961 B1 | 2/2014 | Yang |
| 8,685,776 B2 | 4/2014 | LaFond |
| 8,704,238 B2 | 4/2014 | Yang |
| 8,869,616 B1 | 10/2014 | Sridharamurthy |
| 8,885,170 B2 | 11/2014 | Kilic |
| 8,921,145 B2 | 12/2014 | Shu |
| 2001/0011994 A1 | 8/2001 | Morimoto |
| 2002/0040602 A1 | 4/2002 | Okada |
| 2003/0094046 A1 | 5/2003 | Okada |
| 2003/0209075 A1 | 11/2003 | Okada |
| 2004/0052016 A1 | 3/2004 | Takagi |
| 2004/0231422 A1 | 11/2004 | Okada |
| 2005/0210981 A1 | 9/2005 | Okada |
| 2006/0163453 A1 | 7/2006 | Hynes |
| 2006/0179941 A1 | 8/2006 | Okada |
| 2006/0180896 A1 | 8/2006 | Martin |
| 2006/0185428 A1 | 8/2006 | Combi |
| 2008/0289417 A1 | 11/2008 | Okada |
| 2009/0114016 A1 * | 5/2009 | Nasiri et al. ............... 73/504.12 |
| 2011/0219876 A1 | 9/2011 | Kalnitsky |
| 2012/0048017 A1 | 3/2012 | Kempe |
| 2012/0091854 A1 | 4/2012 | Kaajakari |
| 2012/0227487 A1 | 9/2012 | Ayazi |
| 2013/0019680 A1 | 1/2013 | Kittilsland |
| 2013/0105921 A1 | 5/2013 | Najafi |
| 2013/0126992 A1 | 5/2013 | Ehrenpfordt |
| 2013/0146994 A1 | 6/2013 | Kittilsland |
| 2013/0168740 A1 | 7/2013 | Chen |
| 2013/0181355 A1 | 7/2013 | Tsai |
| 2014/0116135 A1 | 5/2014 | Cazzaniga |
| 2014/0116136 A1 | 5/2014 | Coronato |
| 2014/0124958 A1 | 5/2014 | Bowles |
| 2014/0137648 A1 | 5/2014 | Zolfagharkhani |
| 2014/0138853 A1 | 5/2014 | Liu |
| 2014/0162393 A1 | 6/2014 | Yang |
| 2014/0166463 A1 | 6/2014 | Jahnes |
| 2014/0183729 A1 | 7/2014 | Bowles |
| 2014/0186986 A1 | 7/2014 | Shu |
| 2014/0193949 A1 | 7/2014 | Wu |
| 2014/0203421 A1 | 7/2014 | Shu |
| 2014/0210019 A1 | 7/2014 | Nasiri |
| 2014/0227816 A1 | 8/2014 | Zhang |
| 2014/0230548 A1 | 8/2014 | Coronato |
| 2014/0231936 A1 | 8/2014 | Jahnes |
| 2014/0231938 A1 | 8/2014 | Campedelli |
| 2014/0283605 A1 | 9/2014 | Baldasarre |
| 2014/0287548 A1 | 9/2014 | Lin |
| 2014/0291128 A1 | 10/2014 | Kwa |
| 2014/0311242 A1 | 10/2014 | Lee |
| 2014/0311247 A1 | 10/2014 | Zhang |
| 2014/0318906 A1 | 10/2014 | Deimerly |
| 2014/0319630 A1 | 10/2014 | Conti |
| 2014/0322854 A1 | 10/2014 | Nakatani |
| 2014/0326070 A1 | 11/2014 | Neul |
| 2014/0331769 A1 | 11/2014 | Fell |
| 2014/0339654 A1 | 11/2014 | Classen |
| 2014/0339656 A1 | 11/2014 | Schlarmann |
| 2014/0349434 A1 | 11/2014 | Huang |
| 2014/0352433 A1 | 12/2014 | Hammer |
| 2014/0353775 A1 | 12/2014 | Formosa |
| 2014/0357007 A1 | 12/2014 | Cheng |
| 2014/0370638 A1 | 12/2014 | Lee |
| 2014/0374854 A1 | 12/2014 | Xue |
| 2014/0374917 A1 | 12/2014 | Weber |
| 2014/0374918 A1 | 12/2014 | Weber |
| 2015/0008545 A1 | 1/2015 | Quevy |

FOREIGN PATENT DOCUMENTS

| | | | |
|---|---|---|---|
| WO | 2014159957 | A1 | 10/2014 |
| WO | 2014177542 | A1 | 11/2014 |
| WO | 2014184025 | A1 | 11/2014 |

OTHER PUBLICATIONS

Virtus Sensor Technology by Dr. Mark Boysel, Semicon Japan, Nov. 11, 2008.
Development of a Single-Mass Five-Axis MEMS Motion Sensor, by R.M. Boysel, L.J. Ross, Virtus Advanced Sensors, Inc.., May 2009.
SOI micromachined 5-axis motion sensor using resonant electrostatic drive and non-resonant capacitive detection mode by Yoshiyuki Watanabe, Toshiaki Mitsui, Takashi Mineta, Yoshiyuki Matsu, Kazuhiro Okada, Available online Jan. 18, 2006.

* cited by examiner

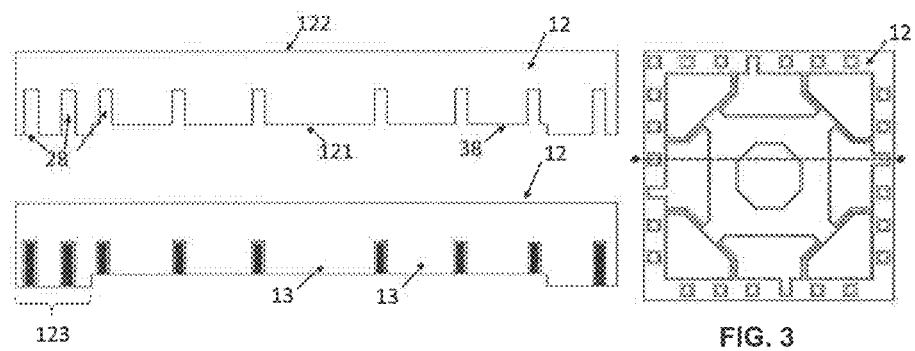
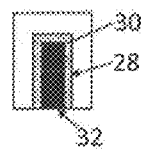
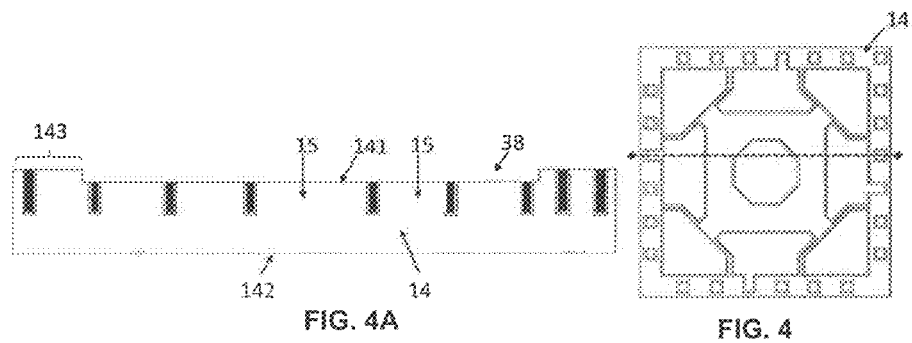

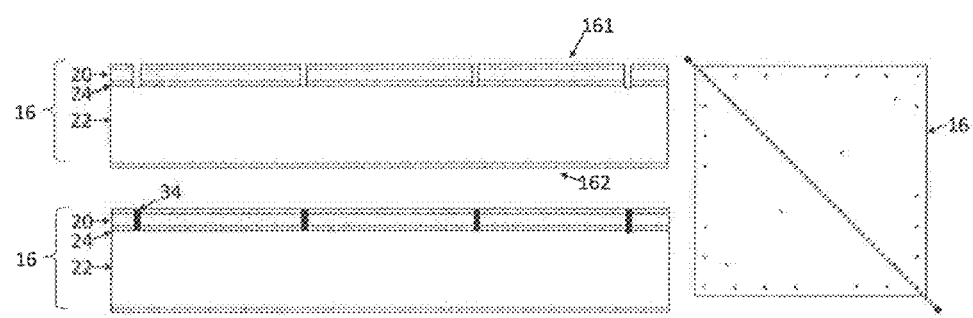
FIG. 5A
FIG. 5B    FIG. 5
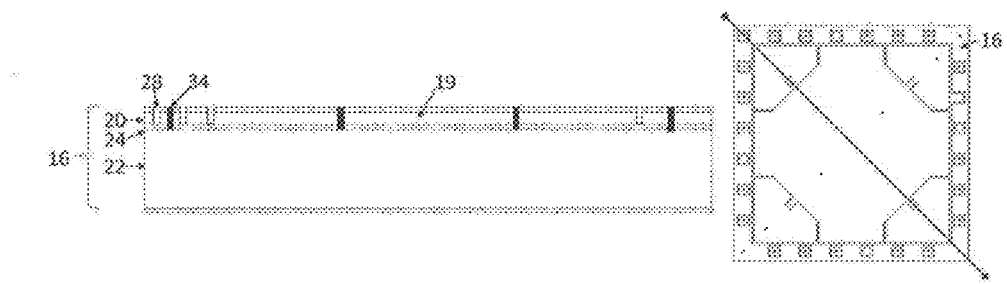
FIG. 6A    FIG. 6

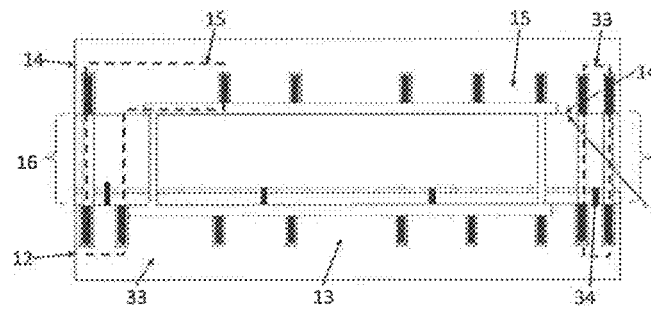
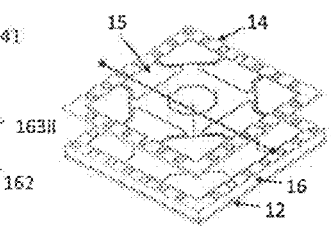
FIG. 9A　　　　　　　　FIG. 9
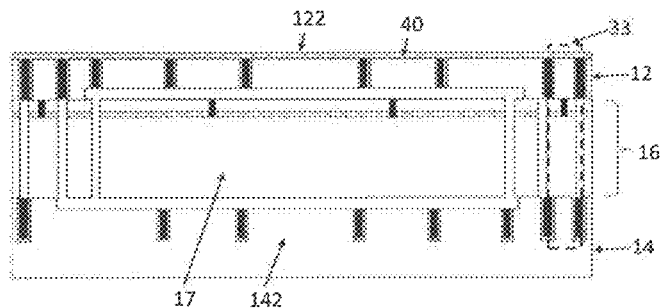
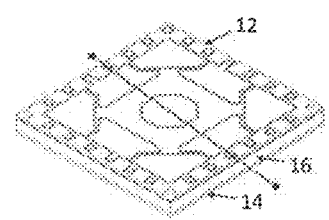
FIG. 10A　　　　　　　FIG. 10

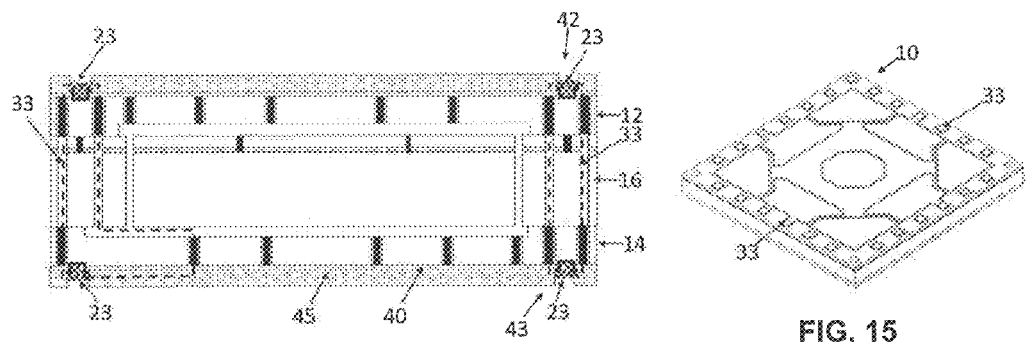
FIG. 15A
FIG. 15
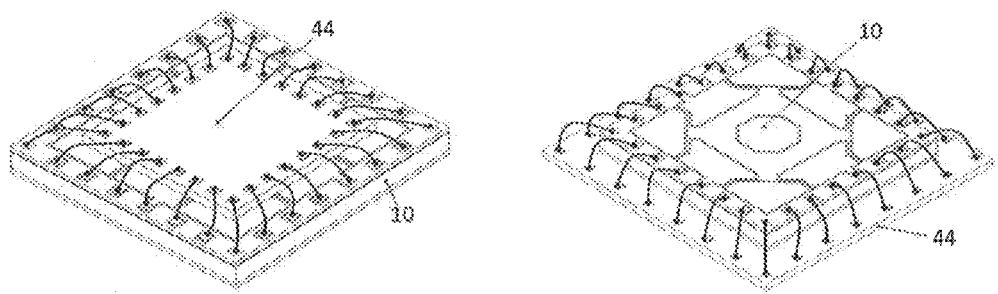
FIG. 16A
FIG. 16B
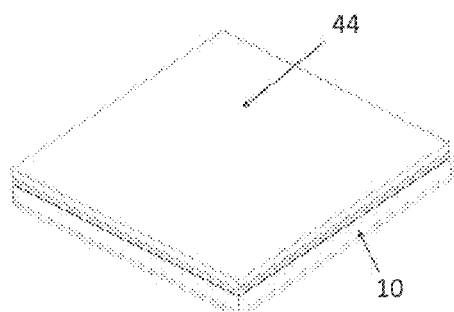
FIG. 16C

3D MEMS DEVICE AND METHOD OF MANUFACTURING

RELATED APPLICATIONS

This patent application is a continuation-in-part of International Application No. PCT/CA2014/050635 filed on Jul. 4, 2014, which claims priority from U.S. Application No. 61/843,598 filed on Jul. 8, 2013, the disclosure of these applications being incorporated herein by reference in their entirety.

TECHNICAL FIELD OF THE INVENTION

This invention relates to MicroElectroMechanical Systems (MEMS) devices enabling electrical measurements from top and/or bottom caps. The invention also relates to a method of manufacturing MEMS devices.

BACKGROUND

MicroElectroMechanical Systems, or MEMS, are an enabling technology. Generally speaking, MEMS devices are integrated circuits containing tiny mechanical, optical, magnetic, electrical, chemical, biological, or other, transducers or actuators. They are manufactured using high-volume silicon wafer fabrication techniques developed over the last 50 years for the microelectronics industry. Their resulting small size and low cost make them attractive for use in an increasing number of applications in consumer, automotive, medical, aerospace/defense, green energy, industrial, and other markets.

In general a MEMS device must interact with a particular aspect of its environment while being protected from damage by the environment. For example, a micro mirror must interact with an electrical addressing signal and with light while being protected from moisture and mechanical damage. An accelerometer must be free to move in response to accelerated motion, but must be protected from dirt and moisture, and perhaps must also be kept under vacuum or low pressure to minimize air damping. In almost every application, an electrical connection must be made between the MEMS transducer or actuator and an external integrated circuit (IC) or printed circuit board (PCB) in order to read the transducer signal or to address the actuator.

Consequently, much effort has gone into developing methods of packaging MEMS devices to protect them while providing access to electrical signals. Initially MEMS packaging consisted of attaching a bare MEMS silicon chip to the base of a metal or ceramic package with adhesive, wire bonding the MEMS to the package leads, and finally attaching a lid to the package. This labor intensive and materially demanding chip-level packaging may account for up to 50-80% of the final packaged device's cost. In many cases, the packaged MEMS still needs to be electrically connected to the IC sensing electronics on a board. As technology improved, the MEMS and IC were integrated into a single package. However, chip placement, wire bonding, and package sealing still led to high device cost.

Numerous subsequent improvements in MEMS packaging have been made to simplify the package and reduce cost. Most of these approaches take advantage of the 2D planar nature of silicon microelectronics fabrication. All microelectronic ICs and most MEMS devices are fabricated by successively depositing thin films such as silicon dioxide, silicon nitride, polycrystalline silicon, metals, etc., using a photolithographic process to form the desired 2D shape of the film (e.g. transistor gate, MEMS accelerometer proof mass, etc.), and to etch a pattern into the film. In some cases, the photolithographic process produces a form into which the film is plated or deposited to form the desired pattern. This process is repeated over and over to form the final device. As a result, most MEMS devices are planar or two-dimensional since they consist of a stack of very thin films, each typically on the order of micrometers thick or less.

Typically, a cap (e.g. silicon or glass) is placed over the MEMS to protect it, and electrical contact is made to the top of the MEMS. Most of these integration approaches are based on a 2D architecture with sensor detection and signal transduction in the plane of the device. For example, almost all accelerometers and gyroscopes use comb capacitors for drive and detection in the plane of the device. The silicon below the MEMS and in the cap above it is non-functional. However, many MEMS applications are inherently 3 dimensional. For example some microfluidics chips need to route fluids in three dimensions. Accelerometer and gyroscope designs benefit from proof masses which have low Brownian noise and can move in three dimensions. In these cases, it is desirable to have sensor electrodes or actuators located above, beneath, within, or around the MEMS elements. These electrodes are not easily accessible using the typical 2D planar architectures described above. Consequently, 3D devices have been largely constrained to packaging architectures that use non-functional package caps.

What is needed is a MEMS device which allows transmitting electrical signals from within the device to at least one cap, while enclosing the MEMS sensing element(s). It would also be desirable to provide a cost-effective manufacturing method for such device.

SUMMARY OF THE INVENTION

A MEMS device is disclosed. The MEMS device includes a MEMS wafer with a MEMS structure. The MEMS wafer has first and second sides. The MEMS device also includes a first or top cap wafer with inner and outer sides. The inner side of this first or top cap wafer is bonded to the first side of the MEMS wafer. The outer side of the first or top cap wafer has electrical contacts. Electrical contacts can include bond pads and/or leads, and can be made of metal, such as aluminum, or polycrystalline silicon. The MEMS device also includes a second or bottom cap wafer with inner and outer sides. The inner side is bonded to the second side of the MEMS wafer. The MEMS wafer, the top/first cap wafer and the bottom/second cap wafer define a cavity for housing the MEMS structure. The MEMS structure can be any sensing element such as, but not limited to, membranes; diaphragms; proof mass(es); comb sensors, actuators, transducers, micro-valves or micro-pumps. The MEMS device also includes insulated conducting pathways extending from within the bottom cap wafer, through the MEMS wafer and through the top cap wafer, to the respective electrical contacts, for routing electrical signals from the bottom cap wafer to the electrical contacts on the top cap wafer. The MEMS wafer, the top cap wafer and the bottom cap wafer are electrically conductive. Preferably, the top cap wafer, the MEMS wafer and the bottom cap wafer are made of a silicon-based semiconductor. They are also preferably bonded with a conductive bond, such as by fusion bonding or with an electrically conductive bonding. The conductive bonding can be a metal seal using gold thermocompression, gold eutectic bonding or copper compression bonding, as possible examples.

In possible embodiments of the device, the insulated conducting pathways include a portion formed by a channel (extending through the entire thickness of the corresponding top cap wafer, MEMS wafer or bottom cap wafer. It is possible for the channel to have its sidewall coated with an insulating material, such as silicon dioxide. Optionally, the inside of the channel can be filled with a conducting material, such as copper or doped polycrystalline silicon.

In possible embodiments of the device, at least one of the conducting pathways comprises a portion formed by a trench surrounding a conductive wafer plug. In some cases, the trench can be filled with an insulating material, such as silicon dioxide.

The insulated conducting pathways can each be made of a top cap wafer channel, a MEMS wafer channel and a bottom cap channel, these channels being aligned at the wafer interfaces.

In possible embodiments of the device, for one or more of the insulated conducting pathways, the top cap wafer channel and/or the bottom cap wafer channel can include a through-silicon via (TSV).

In possible embodiments, one of the electrical contacts on the top cap wafer is connectable to an external potential, the corresponding insulated conducting pathway being a case pathway, preferably located at the periphery of the device.

Preferably, the outer side of the second or bottom cap wafer has electrical contacts. In this case, at least one of the insulated conducting pathways is a device feedthrough extending from one of the electrical contacts on the top cap wafer to one of the electrical contacts on the bottom cap wafer. The electrical contacts on the top and/or bottom caps can be made of a metal stack including a sticking layer such as titanium or titanium/tungsten, polysilicon and a bondable metal such as aluminum, aluminum/silicon, aluminum/silicon/titanium, as examples. The sticking layer can also include polysilicon, chromium and/or nickel and a solderable metal such as gold, gold/palladium or gold/tin.

In possible embodiments, the bottom cap wafer includes bottom cap electrodes. Some of the insulated conducting pathways are in this case respectively connected to the bottom cap electrodes. These pathways are for transmitting electrical signals between the bottom cap electrodes and the corresponding electrical contacts on the top cap wafer.

In possible embodiments, the device includes at least one additional insulated conducting pathway. This additional pathway extends through the MEMS wafer and through the top cap wafer. This one or more additional insulated conducting pathway(s) connects the MEMS structure to one of the electrical contacts on the top cap wafer, for transmitting electrical signals between the MEMS structure and this electrical contact, such as a bond pad.

Preferably, the MEMS wafer is a silicon-on-insulator (SOI) wafer with an insulating layer, typically buried oxide, separating a device layer from a handle layer. The insulated conducting pathways include respective SOI conducting shunts, electrically connecting the device and handle layers. In this case, the MEMS structure is preferably patterned in both the device and handle layers. The shunts can be made of metal, such as aluminum, aluminum silicide, aluminum alloys, chromium, gold, titanium, titanium-tungsten, copper, nickel or other metal. It is also possible to use conducting doped polycrystalline silicon (polysilicon).

In possible embodiments, the top cap wafer includes top cap electrodes. Other additional insulated conducting pathways can thus extend through the top cap wafer between these top cap electrodes and the corresponding electrical contacts on the top cap wafer, for transmitting electrical signals between the top cap electrodes and the corresponding electrical contacts on the top cap wafer.

Preferably, the MEMS device includes a cap insulating layer deposited on the outer side of at least one of the top and bottom cap wafers.

The cavity is preferably is hermetically sealed, or at least has a portion which is hermetically sealed. The MEMS device can include a getter deposited on the top and/or bottom cap. In some embodiments, the cavity can be under vacuum or contain fluid. The fluid can be a gas or a liquid. If a gas, its pressure can be between 1 milliTorr and 1000 Torr. The gas can be nitrogen, argon, sulfur hexafluoride or xenon, as examples only.

A method for manufacturing a MEMS device is also disclosed. The method include a step a) of providing top/first and bottom/second cap wafers, each having respective inner and outer sides, and forming insulated conducting cap wafer channels on the inner sides of the cap wafers. Another step b) consists in providing a MEMS wafer having first and second sides and patterning portions of a MEMS structure and portions of insulated conducting MEMS wafer channels in one of the first and second sides. Next, the method includes a step c) of bonding the side of the MEMS wafer patterned previously to the inner side of the top or bottom cap wafer, by aligning the insulated conducting cap channels of the cap wafer with the portions of the insulated conducting MEMS channels. The method then includes a step d) of patterning the remaining portions of the MEMS structure and the remaining portions of the insulated conducting MEMS wafer channels on the other side of the MEMS wafer. The method includes a step e) of bonding the side of the MEMS wafer patterned in the previous step to the inner side of the other top or bottom cap wafer, by aligning the insulated conducting cap channels of the other cap wafer with the remaining portions of the insulated conducting MEMS channels. Insulated conducting pathways are thus created, extending from the second/bottom cap wafer, through the MEMS wafer and through the first/top cap wafer. The method also includes a step f) of removing a portion of the outer sides of the top and bottom cap wafers to expose and isolate the insulated conducting pathways.

It is possible that step a) comprises the patterning of trenches on the inner sides of the bottom and top cap wafers, with the trenches (28) extending only partially through the cap wafers. This step can also include filling the trenches of the top and bottom cap wafers with an insulating material. Optionally, step a) comprises patterning a recess in at least the top cap wafer to from part of a cavity for housing the MEMS structure. Step a) can be performed by patterning trenches and by filling the trenches with an insulating material, and optionally with a conducting material inside the insulating material, for forming top cap electrodes and/or leads.

Preferably, the MEMS wafer provided in step b) is a SOI wafer with an insulating layer separating a device layer from a handle layer. In this case, the method can include a step of forming SOI conducting shunts through the device layer and the insulating layer.

In a possible embodiment of the method, step b) can include etching trenches surrounding some of the SOI conducting shunts, for forming portions of the insulated conducting MEMS wafer channels. Step b) can also include etching trenches for forming MEMS electrodes and/or leads. Optionally, the step can include etching trenches to form other MEMS sensing structures.

Preferably, step c) is performed by bonding the top cap wafer to the first side of the MEMS wafer with a conductive bond.

Preferably, step d) comprises etching trenches to form the remaining portion of the MEMS structure to and to form conductive wafer plugs part of the insulated conducting MEMS wafer channels.

Still preferably, step e) comprises bonding the bottom cap wafer to the second side of the MEMS wafer with a conductive bond. Steps c) and e) can be made by fusion bonding, or by using a conducting material.

In possible embodiments, step f) comprises steps of grinding and polishing the outer sides of the top and bottom cap wafers. Step f) can also comprise a step of electrically passivating the outer sides of the top and bottom cap wafers with cap insulating layers.

In possible embodiments, the method includes a step g) of forming electrical contacts on the outer side of the top cap wafer, the contacted being connected with the insulated conducting pathways, to allow routing of electrical signals from the bottom cap wafer to some of the electrical contacts on the top cap wafer. Preferably, step g) further comprises forming electrical contacts on the outer side of the bottom cap wafer, connected to some of the insulated conducting pathways, to allow routing of electrical signals to the electrical contacts on the bottom cap wafer. Still preferably, step g) comprises creating openings in the cap insulating layer on the outer side of cap wafer(s), in line with the insulated conducting wafer cap channels. Step g) also preferably includes applying a metallic layer on the cap insulating layer and patterning the metallic layer to form electrical leads and bond pads. Finally, step g) will also preferably include a step of applying a passivating film over the electrical leads and the bond pads, and creating openings in the passivating film over the bond pads.

Of course, other processing steps may be performed prior, during or after the above described steps. The order of the steps may also differ, and some of the steps may be combined.

DESCRIPTION OF THE DRAWINGS

It is noted that the appended drawings illustrate only exemplary embodiments of the invention and are, therefore, not to be considered limiting of its scope, for the invention may admit to other equally effective embodiments.

FIGS. 3, 3A, 3B and 3C are views of a MEMs device in which FIG. 3 is a bottom view of a first or top cap wafer of the MEMS device of FIG. 1. FIGS. 3A and 3B are cross-sectional views of FIG. 3. FIG. 3A shows the etching of trenches in the top cap wafer. FIG. 3B shows the filling of the trenches of the top cap wafer with insulating and conducting material, for forming top cap wafer electrodes and channels. FIG. 3C is an enlarged view of a filled trench, according to a possible embodiment.

FIGS. 4 and 4A are views of the MEMs device in which FIG. 4 is a top view of a second or bottom cap wafer of the MEMS device of FIG. 1. FIG. 4A is a cross-sectional view of FIG. 4, showing trenches of the bottom wafer cap filled with insulating and conducting material, for forming bottom cap wafer electrodes and channels.

FIGS. 5, 5A and 5B are views of the MEMs wafer in which FIG. 5 is a top view of the MEMS wafer of the MEMS device of FIG. 1, during one of the manufacturing step. In this embodiment, the MEMS wafer is a SOI wafer. FIGS. 5A and 5B are cross-sectional views of the MEMS wafer of FIG. 5, showing the fabrication of SOI conducting shunts.

FIGS. 6 and 6A are views of the MEMs wafer in which FIG. 6 is a top view of the MEMS wafer during another manufacturing step. FIG. 6A is a cross-sectional view of the MEMS wafer of FIG. 6, showing the patterning of part of the MEMS structure and of the MEMS wafer channels in the device layer.

FIGS. 7 and 7A are views of the top cap wafer in which FIG. 7 is an exploded view of the top cap wafer of FIG. 3 and of the MEMS wafer of FIG. 6. FIG. 7A is a cross-sectional view of the top cap wafer bonded to the MEMS wafer, showing the alignment of the top cap wafer with the first side of the MEMS wafer, which in this embodiment corresponds the device layer side.

FIGS. 8 and 8A are view of the MEMs wafer in which FIG. 8 is a top view of the second side of the MEMS wafer, which in this embodiment corresponds to the handle layer side. FIG. 8A is a cross-sectional view of the MEMS wafer bonded to the top cap wafer, turned upside down, for patterning the remaining portion of the MEMS structure and of the MEMS wafer channels in the handle layer.

FIGS. 9 and 9A are views of the bottom cap wafer in which FIG. 9 is an exploded view of the bottom cap wafer (located on top) and of the MEMS wafer bonded to the top cap wafer. FIG. 9A is a cross-sectional view of the bottom cap wafer bonded to the MEMS wafer, showing the alignment of the bottom cap wafer with the second side of the MEMS wafer, which in this embodiment corresponds the device layer side.

FIGS. 10 and 10A are views of the MEMs device in which FIG. 10A is a cross-sectional view of the MEMS device during its manufacturing, after grinding, polishing, and passivation of the top cap wafer.

FIGS. 15 and 15A are views of the MEMs device in which FIG. 15 is a top side perspective view of the MEMS device of FIG. 1. FIG. 15A is a cross-sectional view of the MEMS device of FIG. 15, showing the openings in the insulating film over the pond pads.

FIG. 16A is a perspective view of a MEMS device, shown with a CMOS IC stacked on its top cap wafer, and electrically bonded to it with wire bonds.

FIG. 16B is a perspective view of a MEMS device, stacked on a CMOS IC and electrically bonded to it with wire bonds.

FIG. 16C is a perspective view of a CMOS IC flip-chip bonded to a MEMS device.

DETAILED DESCRIPTION OF AN EMBODIMENT OF THE INVENTION

Figure 1:
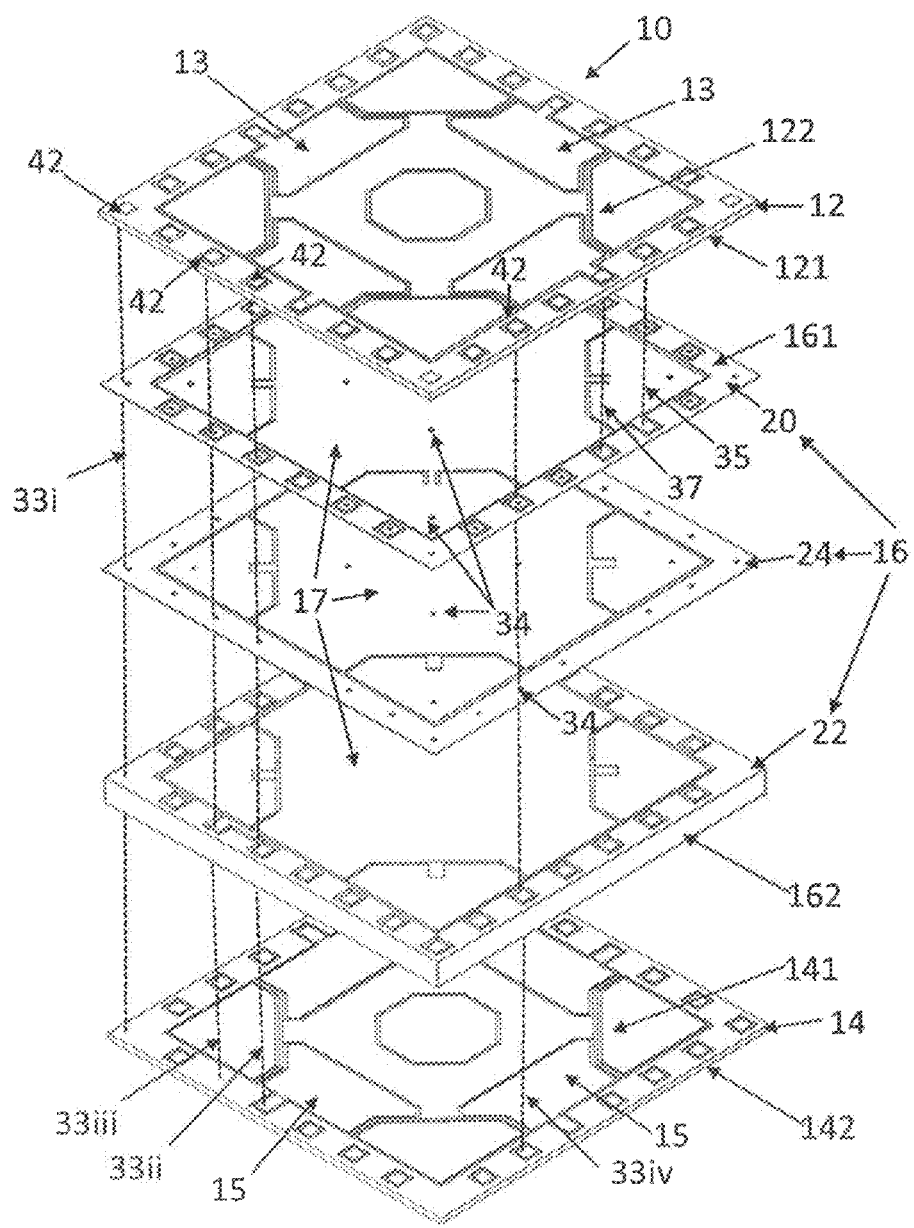
FIG. 1 is an exploded view of a MEMS device, according to a possible embodiment of the invention.

Within the following description, similar features of the drawings have been given similar reference numerals. To preserve the clarity of the drawings, some reference numerals have been omitted when they were already identified in a preceding figure.

The present invention provides a MEMS device formed by a top cap wafer, a central MEMS wafer and a bottom cap wafer, the wafers being made of an electrically conducting material, such as silicon. The MEMS device includes insulated conducting pathways extending from the bottom cap wafers, through the MEMS wafer and to the top cap wafers, allowing routing or transmitting electrical signals through the MEMS device, from the bottom cap wafer to the top cap wafer. This architecture of the MEMS device enables the placement of electrodes and electrical leads above, below, and/or around MEMS structure(s)—such as membrane(s) or diaphragm(s), proof masse(s)micro-valve(s), sensor(s) and transducer(s), comb sensor(s), micro-pumps, etc., and allows conducting or routing of the signals to at least one side of the device, where the signals can be accessed for signal processing. Additionally, this architecture enables wire-bond-free electrical connection to an integrated circuit (IC) which can be flip-chip bonded to the top of the MEMS device either at the chip or wafer level, reducing the cost of MEMS and IC integration, as well as packaging complication and packaging cost.

Throughout the description, the term "MEMS device" encompasses devices such as, but not limited to, accelerometers, gyroscopes, pressure sensors, magnetometers, actuators, micro-fluidic devices, and micro-optic devices. The MEMS device may also include microelectronic circuits such as power amplifiers, detection circuitry, GPS, microprocessors, and the like. Further details regarding devices and operation of such sensors are set forth in International Application No. PCT/CA2014/050730 filed on Aug. 1, 2014 and corresponding U.S. Application No. filed on Feb. 13, 2015, the entire contents of these applications being incorporated herein by reference.

Referring to FIG. 1, an exploded view of the different layers of a MEMS device 10 according to a possible embodiment is shown. The MEMS device 10 is thus formed by a multi-wafer stack. The MEMS device 10 includes a top cap wafer 12 having inner and outer sides 121, 122; a MEMS wafer 16 having first and second sides 161, 162; and a bottom cap wafer 14 having inner and outer sides 141, 142. The MEMS wafer 16, the top cap wafer 12 and the bottom cap wafer 14 are electrically conductive, and at least the outer side 122 of the top cap wafer 12 has electrical contacts 42. The MEMS wafer 16 can consist of a standard wafer, a silicon-on-insulator (SOI) wafer, or of multiple wafers. The top, bottom and MEMS wafers are preferably made of silicon-based material. In this embodiment, the MEMS wafer 16 is a SOI wafer with an insulating layer 24 separating a device layer 20 from a handle layer 22. The MEMS wafer 16 includes a MEMS structure 17, which includes in this particular embodiment a suspended motion sensor proof mass and flexural springs. When bonded, the MEMS wafer 16, the top cap wafer 12 and the bottom cap wafer 14 define a cavity for housing the MEMS structure 17, as best shown in the cross-sectional views in FIGS. 2A-2F. The MEMS structure 17 is surrounded by top and bottom cap electrodes 13, 15 (only a few electrodes are identified on the figures, so as to not burden them). The top and bottom cap wafers each preferably comprise several electrodes, and the MEMS wafer can include electrodes as well, on the side of the device and/or on the MEMS structure 17.

In the present description, the terms "top" and "bottom" relate to the position of the wafers as shown in the figures. Unless otherwise indicated, positional descriptions such as "top", "bottom" and the like should be taken in the context of the figures and should not be considered as being limitative. The top cap wafer can also be referred as a first cap wafer, and the bottom cap wafer can be referred as a second cap wafer. The terms "top" and "bottom" are used to facilitate reading of the description, and persons skilled in the art of MEMS know that, when in use, MEMS devices can be placed in different orientations such that the "top cap wafer" and the "bottom cap wafer" are positioned upside down. In this particular embodiment, the "top" refers to the direction of the device layer.

Still referring to FIG. 1, when the layers are assembled and form the MEMS device 10, the inner side 121 of the top cap wafer 12 is bonded to the first side 161 of the MEMS wafer 16, and the inner side 141 of the bottom cap wafer is bonded to the second side 162 of the MEMS wafer 16. In this particular embodiment, the top cap 12 is bonded to and electrically in contact with the device layer 20. The bottom cap 14 is bonded to and electrically in contact with the handle layer 22. The insulating layer 24, which typically consists of buried oxide, insulates the top half of the device 10 from the bottom half. SOI conducting shunts 34 are provided through the insulating layer 24 to make electrical connection between the device layer 20 and handle layer 22, in specific desired places. The top cap wafer 12, the MEMS wafer 16 and the bottom cap wafer 14 are typically bonded with a conductive bond.

The MEMS device 10 includes insulated conducting pathways 33i, 33ii, 33iii, and 33iv extending from within the bottom cap wafer 14, through the MEMS wafer 16 and through the top cap wafer 12, to the respective electrical contacts 42, for routing electrical signals from the bottom cap wafer 14 to the electrical contacts 42 on the top cap wafer 12. The stack thus comprises electrically isolated "three dimensional through-chip vias" (3DTCVs) to route signals from the bottom cap 14 (such as from bottom cap electrodes 15), through the MEMS wafer 16 to and through the top cap wafer 12, to electrical contacts 42, such as bond pads, on the outer side 122 of the top cap wafer 12. The term 3DTCV thus refers to an insulated conducting pathway extending in one or more directions in the MEMS device (i.e. transversal to and/or in the plane of the wafers).

Figure 2A:
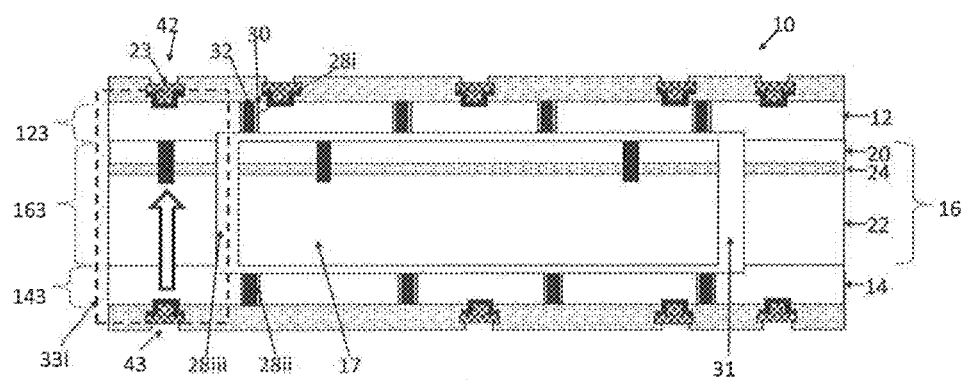
FIGS. 2A to 2F are different cross-sectional views of a MEMS device of FIG. 1, each view showing an insulated conducting pathway through the MEMS device.
Figure 2B:
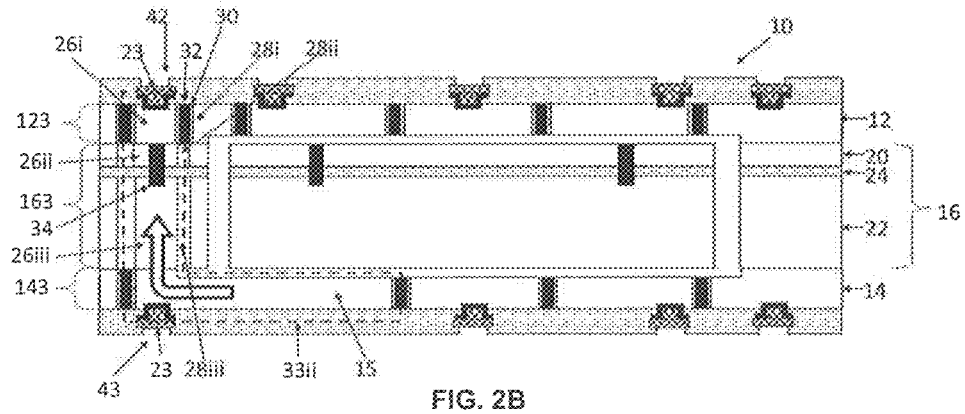
Figure 2C:
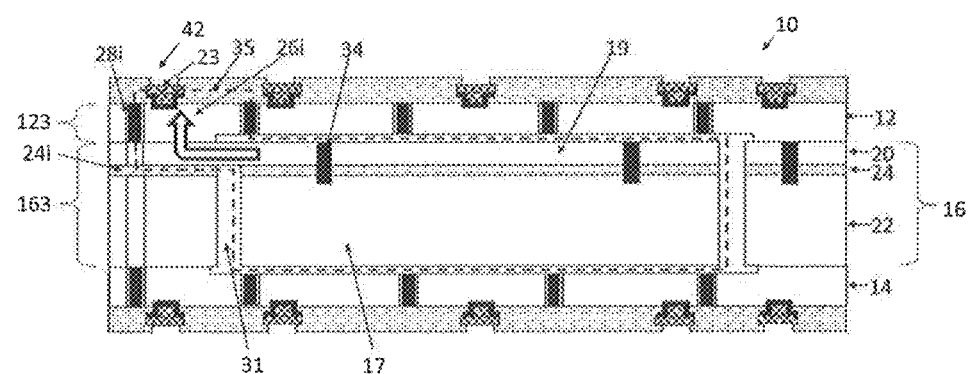
Figure 2D:
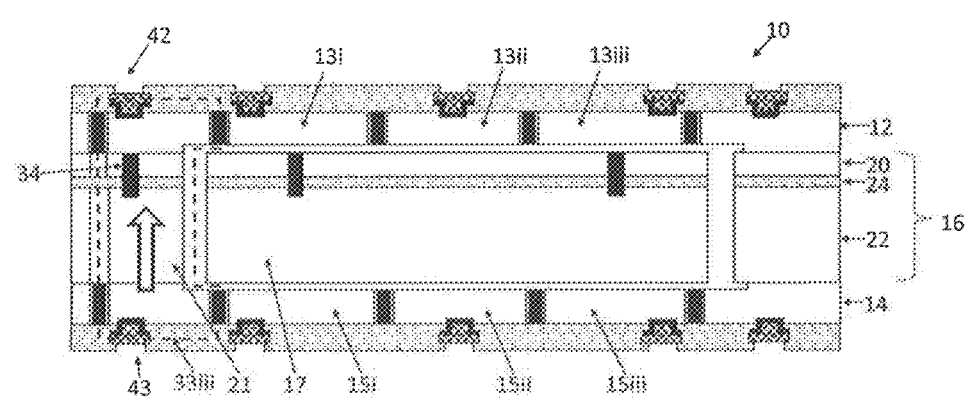
Figure 2E:
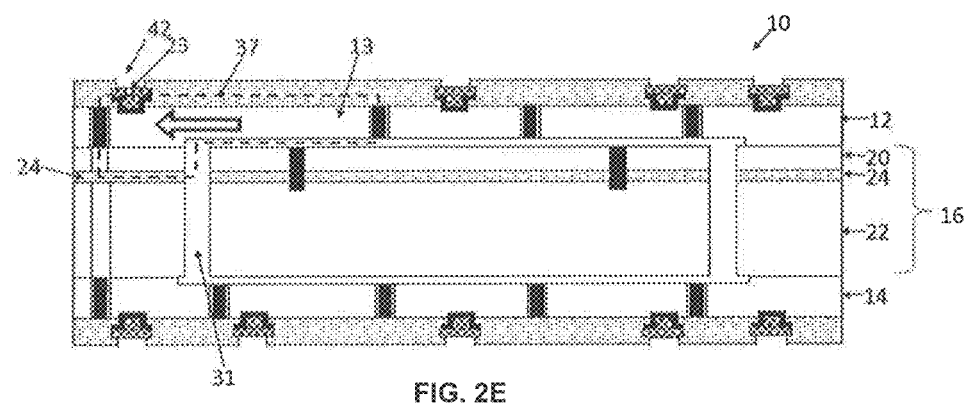

Referring now to FIGS. 2A-2F, these cross sectional views show different insulated, electrically conducting pathways provided in the MEMS device. It is desirable to electrically connect the top cap wafer 12, the MEMS wafer 16 (in this case including the device and handle layers 20, 22) and the bottom cap wafer 14 for different reasons, as will be explained in more detail below. One or more of the insulated conducting pathways include at least a portion extending through the entire thickness one of the top cap wafer, MEMS wafer, or bottom cap wafer. Some of the insulated conducting pathways 33i-33iv are formed by a top cap wafer channel 123, a MEMS wafer channel 163 and a bottom cap channel 143, these channels being aligned at the wafer interfaces (such as shown in FIGS. 2A, 2B, 2D and 2F) to form the conducting pathways. One or more additional insulated conducting pathways 35 extend through the MEMS wafer 16 and through the top cap wafer 12 only (as shown in FIG. 2C), while yet other additional insulated conducting pathway(s) 37 extend through the top cap wafer only (as shown in FIG. 2E).

Referring to FIG. 2A, the insulated conducting pathway 33i is formed by a top cap wafer channel 123, a MEMS wafer channel 163 and a bottom cap channel 143. In this case, the insulated conducting pathway 33i is insulated in part by the outer sidewall of the MEMS device, and by trenches 28i, 28ii, 28iii formed in the top, MEMS, and bottom cap wafers 12, 16, 14. The trenches 28i, 28ii in the top and bottom cap wafers 12, 14 are filled with an insulating material 30, and also optionally with a conducting material 32 inside of the insulating material 30, while the trenches in the MEMS wafer are empty, as they delineate the cavity 31 in which the MEMS structure 17 is housed. The electrical contact 42 (a bond pad 23) on the top cap wafer 12 is connectable to an external potential, such that the corresponding insulated conducting pathway 33i can be used as a case pathway. Case pathways 33i are typically located at the periphery of the device 10. As an alternative, or in addition, the electrical contact 43 can be connected to the external potential. Typically, the external potential is at 0V, and the case pathway 33i is a ground case, but it is possible for some applications to connect the case pathway 33i to another potential, such as 5V for example.

Referring to FIG. 2B, it is also desirable to isolate one or more bottom cap electrodes 15 and independently feed them up through the MEMS wafer 16 and the top cap wafer 12 to the bond pad 23 on the top cap wafer 12. The insulated conducting pathway 33ii comprises a top cap wafer channel 123, a MEMS wafer channel 163 and a bottom cap wafer channel 143, the three channels being electrically connected. The top cap wafer channel 123 is formed by a trench 28i surrounding a conductive wafer plug 26i, the trench 28i being filled with an insulating material 30 to isolate the wafer plug 26i. More specifically, the trench 28i has its sidewall coated with the insulating material 30 and optionally the inside of the trench 28i is filled with a conducting material 32 (best shown enlarged in FIG. 3C). The MEMS wafer channel 163 consists of wafer plugs 26ii, 26iii surrounded by closed trenches 28ii, 28iii. The trenches 28ii, 28iii are patterned in the device and handle layers 20, 22 of the MEMS wafer 16. A SOI conducting shunt 34 electrically connects the device and handle layers (and more specifically the plugs 26ii and 26iii), allowing signals to transit through the entire thickness of the MEMS wafer 16. The bottom cap wafer channel 143 is connected to (or forms part of) the bottom cap electrode 15. The insulated conducting channel 33ii thus connects the bottom cap electrode 15 and the electrical contact 42 on the top cap wafer 12. This pathway 33ii can be used to transmit signals to and from the bottom cap electrode 15, for example to detect a change of capacitance between the top and bottom electrodes 13, 15 when the MEMS structure 17 moves, in applications for which the MEMS device 10 is used as a motion sensor. Optionally, an electrical contact 43 (in the form of a bond pad 23) can be provided in the bottom cap wafer 14 as well, allowing transmitting signals to/from the bottom cap electrode 15 to the electrical contact 43. It is worth noting that for clarity, not all electrodes are identified in the MEMS device. Of course, some or all of the bottom cap electrodes can be connected to similar insulated conducting pathways.

Referring to FIG. 2C, it is also desirable to be able to isolate parts of the device layer 20 only, such as for MEMS electrodes 19 provided in the device layer. It is also desirable to isolate portions of the device which extend through the entire thickness of the MEMS wafer 16 (combining the handle layer 22, the device layer 20, and the insulating layer 24) in order to feed signals from the MEMS structure 17 through the top cap wafer 12 to electrical contacts (such as bond pads). In FIG. 2C, an additional insulated conducting pathway 35 extends through the MEMS wafer 16 and through the top cap wafer 12, connecting the MEMS structure 17 to one of the electrical contacts 42 on the top cap wafer 12. In this case, this additional insulated conducting pathway 35 includes a top cap wafer channel 123 and a MEMS wafer channel 163. The top cap wafer channel 123 is formed by a wafer portion 26i surrounded by a closed trench 28i, the trench 28i being filled with an insulating material and optionally with a conducting material. The MEMS wafer channel 163 is delimited in part by a portion of the buried oxide layer 24i and by the cavity 31 housing the MEMS structure 17. A SOI conducting shunt 34 allows connecting the device and handle layers in the MEMS structure 17. The bond between the top cap wafer 12 and the MEMS wafer 16 being conductive, the top cap wafer channel 123 and the MEMS wafer channel 163 are electrically connected, and form the additional insulated conducting pathway 35. This pathway can be used for example to send a signal to the MEMS structure 17. In this embodiment, the MEMS structure 17 is a suspended proof mass, and signals can be sent via the pathway 35 to rock the proof mass at a predetermined frequency, for example in gyroscope applications.

Referring to FIG. 2D, it is also desirable to isolate electrodes 21 along the sides of the cavity inside the MEMS wafer 16. The insulated conducting pathway 33iii extends through the top and bottom cap wafers 12, 14 and through the MEMS wafer 16. The pathway 33iii is delimited by filled trenches in the top and bottom cap wafers 12, 14, and by empty trenches formed in the device and handle layers 20, 22 to delimit the MEMS structure 17. The pathway 33iii thus defines a side electrode 21, which can be used in addition to top and bottom cap electrodes 13i, 13ii, 13iii, 15i, 15ii, 15iii, to detect motion of the MEMS structure 17. The pathway 33iii is connected to an electrical contact 42 in the top cap wafer, and also optionally to the contact 43 in the bottom cap wafer.

Referring to FIG. 2E, top cap electrodes 13 on the top cap wafer 12 can also be isolated and connected to electrical contacts 42. This is done with other additional insulated conducting pathways, extending through the top cap wafer 12 between the top cap electrodes 13 and the bond pads 23. In FIG. 2E, an example of such a pathway, identified with reference 37, permits the transmission of electrical signals between the top cap electrode 13 and the corresponding electrical contact 42, in this case the bond pad 23. The insulated conducting pathway 37 is delimited in part by the buried oxide forming the insulating layer 24 and by the cavity 31.

Figure 2F:
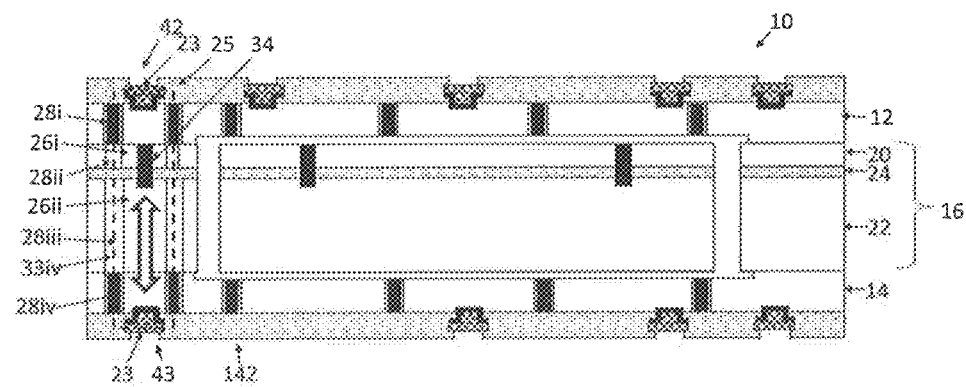

Referring to FIG. 2F, electrical contacts 43, such as bond pads, can also be located on bottom cap 14 to pass signals through the MEMS device 10, for example, from an IC on top, through the MEMS device 10, to an underlying IC or PCB. The outer side 142 of the bottom cap wafer 14 has electrical contact(s) 43, such as bond pads 23, and the insulated conducting pathways 33iv is a device feedthrough 25 extending from the electrical contacts 42 on the top cap wafer 12 to the electrical contacts 43 on the bottom cap wafer 14. The insulated conducting pathway 33iv is formed in the top and bottom cap wafers 12, 14 by trenches 28i, 28iv filled with an insulating material, and optionally with a conducting material inside the insulated trenches; and by trenches 28ii, 28iii formed in the device and handle layers 20, 22. The trenches 28*ii*, 28*iii* surround respective silicon wafer plugs 26*i*, 26*ii*, connected by an SOI conducting shunt 34.

While in the embodiments shown the insulated conducting pathways are typically formed with filled or empty trenches surrounding plugs of silicon wafer, it is also possible in other embodiments that the top and/or bottom cap wafers, and also possibly the MEMS wafer, include through-silicon-vias (TSVs) to form portions of the insulated conducting pathways.

As can be appreciated, an aspect of the architecture is the use of insulated channels in a multi-wafer stack, to isolate individual electrodes and interconnects on the top and bottom cap wafers. Channels are etched to "outline" the borders of the electrodes, leads, feedthroughs, and bond pads on the inward-facing surfaces of the top and bottom wafers. These channels are then filled with an insulating material such as thermal oxide or chemical vapor deposition (CVD) silicon dioxide. One possible fabrication method utilizes Through-Silicon-Via (TSV) processes to form at least parts of the insulated conducting pathways. In the case of TSVs, a hole is etched into a silicon wafer and thermal oxide or CVD oxide is deposited on the wafer to insulate the sidewall of the hole. The hole is then filled with a conducting material such as copper or polysilicon to provide an isolated conducting path through the silicon. Another possible fabrication method utilizes a closed or annular trench filled only with an insulator. This filled trench is used to isolate a plug of silicon which then acts as the TSV. For manufacturing the MEMS device of the invention, different TSV processes can be used to isolate electrodes and form insulated channels in the top and bottom cap wafers. The various conducting pathways required by the device are constructed by aligning channels from the top cap, MEMS and/or bottom cap wafers at the wafer interfaces. Some of the insulated conducted pathways allow electrical signals to travel to and from the bottom cap electrodes 15 through the aligned insulated channels in the cap and MEMS wafers. Insulated channels in the MEMS wafer form feedthroughs. In the case of SOI MEMS wafers, feedthroughs are formed in the SOI device layer and handle layer, which are connected by SOI conducting shunts. The feedthroughs on the MEMS wafer can be isolated either by insulator-filled channels or by etched open trenches since the MEMS wafer is completely contained within the stack and the isolation trenches do not have to provide a seal against atmospheric leakage like the cap trenches. An advantage of the MEMS device is that, since the MEMS is located between top and bottom caps, the cavity housing the MEMS structure can be hermetically sealed. If needed, the cavity can be under vacuum or filled with fluid, such as inert gases or liquids. After the wafer stack is assembled, the cap wafers 12, 14 are ground and polished to expose the isolated conducting regions. The fabrication process of the MEMS device will be explained in greater detail below.

Fabrication

The method for manufacturing the MEMS device will be described in connection with a preferred embodiment. However, it will be understood that there is no intent to limit the invention to the embodiment described.

Referring to FIGS. 3, 3A-3B, 4 and 4A, to begin construction of the MEMS device according to a possible embodiment, top and bottom cap wafers are provided. The top wafer 12 has an inner side 121 and an outer side 122, and the bottom cap wafer 14 has an inner side 141 and an outer side 142. The top and bottom cap wafers 12, 14 are preferably silicon-based wafers. Insulated conducting cap wafer channels 123, 143 are formed on the inner sides 121, 141 of the cap wafers 12, 14. Trenches 28 are patterned on the inner sides 121, 141, the trenches 28 extending only partially through the cap wafers 12, 14. The trenches 28 of the top and bottom cap wafers 12, 14 are then filled with an insulating material 30, and optionally with a conducting material 32 as well (as best shown in FIG. 3C). For some embodiments of the device, it may be required to pattern a recess 38, at least in the top cap wafer 12 to from part of a cavity which will eventually house the MEMS structure. The bottom cap wafer 14 can also be patterned with a similar recess 38. The top cap wafer 12 can also be patterned with trenches 28, and the trenches 28 being filled with an insulating material to form top cap electrodes 13 and/or leads. Preferably, the bottom cap wafer is also patterned is a similar fashion to create bottom cap electrodes 15 and leads. Numerous processes are available at different MEMS fabrication facilities and the insulating and conducting materials 30, 32 vary between them. In this embodiment, islands of conducting wafer (typically silicon) in the shape of the channels 123, 143 and electrodes 13, 15 are surrounded by insulating barriers, patterned into the silicon with a sufficient depth greater than the final desired cap thickness.

Referring to FIGS. 5, 5A-5B, a MEMS wafer 16 is provided, having first and second sides 161, 162. Portions of a MEMS structure (identified in FIG. 6), including in this example a proof mass with four flexural springs, and portions of insulated conducting MEMS wafer channels, are patterned in the first or top side 161 of the MEMS wafer 16. It would also be possible to first pattern the second or bottom side 162 instead. In this embodiment, the MEMS wafer 16 is an SOI wafer with an insulating layer 24 separating the device layer 20 from the handle layer 22. SOI conducting shunts 34 are formed through the device layer 20 and the insulating layer 24 (typically buried oxide), by first opening vias in the device and insulating layer 20, 24, and possibly slightly in the handle layer 24, and by filling the vias with a conducting material, such as doped polycrystalline silicon (polysilicon), metal, or other conducting material. In this way, a SOI conducting shunt 34 is formed vertically between the device and handle layers 20, 22 at desired spots.

Referring to FIGS. 6 and 6A, trenches 28 surrounding some of the SOI conducting shunts 34 are etched, for forming the portions of insulated conducting MEMS wafer channels (such as feedthoughs). In some embodiments, this step can include etching trenches 28 in the device layer 20 for forming other MEMS structures and elements such as pressure sensors, magnetometers, electrodes 19 and/or leads.

Figures 7, 7A:
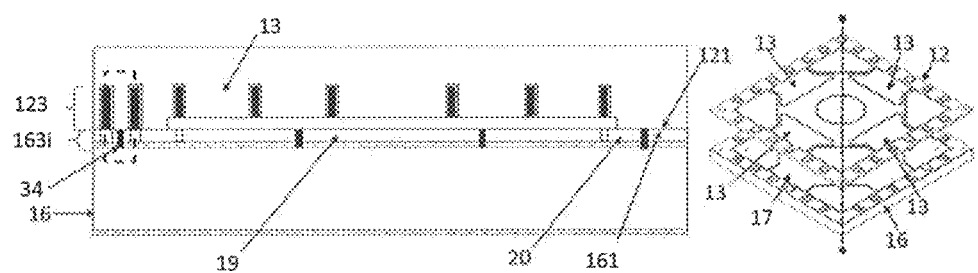

Referring to FIGS. 7 and 7A, the side of the MEMS wafer patterned in the previous step is bonded to the inner side of the top or bottom cap wafer, by aligning the eventual insulated conducting cap channels 123 with the portions 163*i* of the eventual insulated conducting MEMS channels 163. In this example, it is the first side 161 of the MEMS wafer that is bonded to the top cap wafer 12. Of course, it would have been possible to first pattern the handle layer and to bond it with the patterned bottom cap wafer. Bonding the top cap wafer 12 to the first side 161 of the MEMS wafer 16 is made with a conductive bond. Preferably, fusion bonding is used but other alternatives can be considered, such as using a conducting material. Bonding can be made for example using gold thermocompression bonding, or gold-silicon eutectic bonding. In this embodiment where the MEMS wafer is a SOI wafer, the top cap wafer 12 is aligned and bonded to the SOI device layer 20 on the MEMS wafer 16. The feedthrough pads on the SOI Device layer 20 are aligned to the corresponding pads on the top cap wafer 12 and the electrodes 13 on the top cap wafer 12 are aligned to the relevant electrodes 19 on the MEMS wafer 16.

Figures 8, 8A:
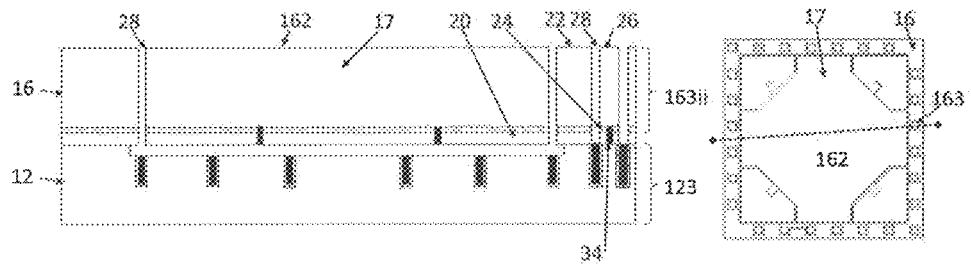

Referring to FIGS. 8 and 8A, the remaining portions of the MEMS structure 17 and the remaining portions 163ii of the insulated conducting MEMS wafer channels 163 are patterned on the other side 162 of the MEMS wafer 16. This step can be conducted by etching trenches 28 to form the remaining portion of the MEMS structure 17 and to form conductive wafer plugs 26 part of the insulated conducting MEMS wafer channel 163. In the present example, the other side corresponds to the handle layer 22, and the proof mass and electrodes are aligned to similar elements, such as electrodes and springs on the device layer 20. In this example, the MEMS wafer channel 163 will eventually form part of a device feedthrough, located in the periphery of the handle layer 22. Trenches 28 are etched around the conductive silicon wafer plug 26 to isolate it from the rest of the layer 22. The SOI conducting shunt 34 in the device and insulating layers 20, 24 provides electrical conductivity within the channel 163. If there were no shunt 34, the silicon plug would merely be a mechanical support.

Referring to FIGS. 9 and 9A, the side 162 of the MEMS wafer 16 patterned in the previous step is next bonded to the inner side 141 of the other cap wafer, which in this case is the bottom cap wafer 14. The bonding step is made by aligning the insulated conducting cap channels of the wafer cap 14 with the remaining portions 163ii of the insulated conducting MEMS channels, thereby creating insulated conducting pathways 33 extending from the bottom cap wafer 12, through the MEMS wafer 16 and through the top cap wafer 14. Similar to the bonding of the other cap wafer, the bond is a conductive bond, which can be performed using various bonding method such as fusion bonding or bonding with a conducting material, such as gold thermocompression bonding or gold-silicon eutectic bonding for example. The bond is used to provide electrical contact between the channels in the MEMS wafer and the channels 143 in the cap wafer 14, some of which are connected electrically to the bottom electrodes 15. In this manner, a conductive pathway 33 is provided from a bottom electrode 15 through the bottom cap silicon pad, handle feedthrough, SOI conducting shunt, and SOI device layer pad to the top cap wafer pad. At this point the MEMS wafer 16 is hermetically sealed between the cap wafers 12, 14. The MEMS structure 17 is aligned with electrodes of the top cap and/or bottom cap and/or any handle side electrodes. Because the insulating channels do not yet fully penetrate the caps, the electrodes 13, 15 on each cap are shorted together through the remaining silicon.

Referring to FIG. 10A, a portion of the outer sides 122, 142 of the top and bottom cap wafers 12, 14 is removed to expose and isolate the insulated conducting pathway 33. This step can be conducted by grinding and polishing the outer sides of the top and bottom cap wafers. Preferably, the outer sides of the top and bottom cap wafers 12, 14 are electrically passivated with a cap insulating layer 40. In the example shown, only the side 122 of the top cap is removed and passivated, since other optional steps are conducted afterwards. It should be noted that it is possible to grind the outer side of both the top and bottom cap wafers, passivate them, and stop the process at this point, such that the next steps are performed later, in the same or in a different plant. Indeed, in this step, insulated conducting pathways are formed which extend from the bottom cap wafer, through MEMS wafer, to the cap wafer.

However, the manufacturing the MEMS device 10 typically comprises the step of forming electrical contacts on at least the outer side 122 of the top cap wafer 12. The electrical contacts on the top cap are connected with the insulated conducting pathway 33, and allow to route electrical signals from the bottom cap wafer 14 to the electrical contacts on the top cap wafer 12. Preferably, the method further comprises forming electrical contacts on the outer side 142 of the bottom cap wafer 14 as well. These electrical contacts 43, being connected to some of the insulated conducting pathway 33, allow the routing of electrical signals from the conducting pathway 33 to the electrical contacts 43 on the bottom cap wafer 14.

This step of forming electrical contacts on the outer sides of the top and/or bottom cap wafers can be made as follows. The procedure is illustrated for one side of the MEMS device only, but of course the same steps can be performed on the other side as well.

Figure 11A:
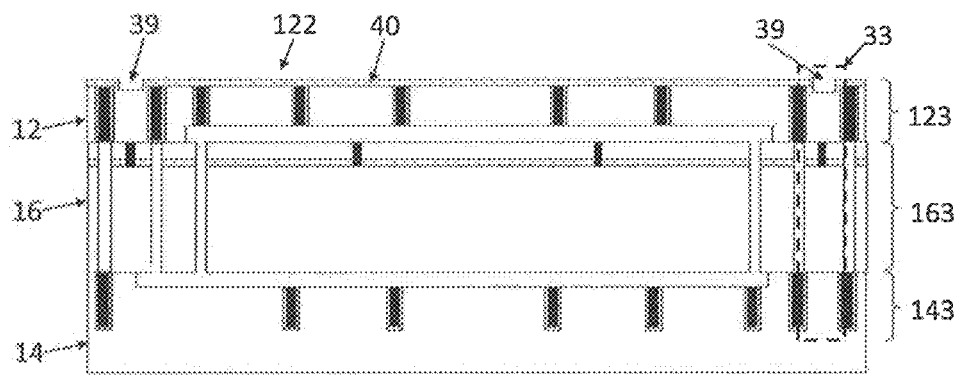
FIG. 11A is a cross-sectional view of the MEMS device of FIG. 10A, after opening contacts in the cap insulating layer of the top cap wafer, for connection with the insulated conducting pathways.

Referring to FIG. 11A, openings 39 are created in the cap insulating layer 40 on the outer side 122 of cap wafer 12, in line with the insulated conducting wafer cap channels 123.

Figure 12A:
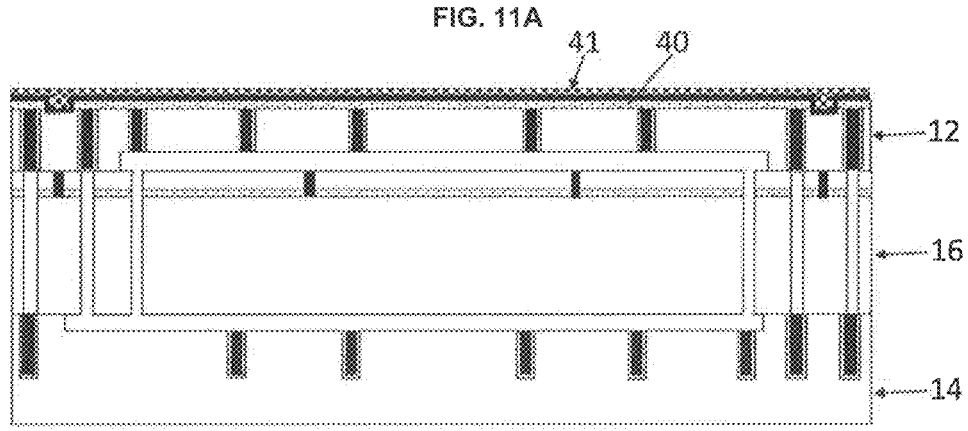
FIG. 12A is a cross-sectional view of the MEMS device of FIG. 11A, after applying a metallic layer on the cap insulating layer.
Figure 13A:
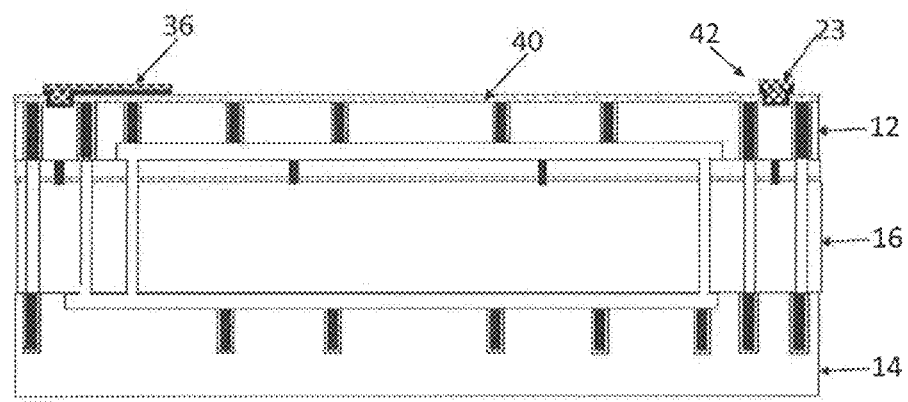
FIG. 13A is a cross-sectional view of the MEMS device of FIG. 12A, after patterning the metallic layer to leave bond pads and leads.
Figure 14A:
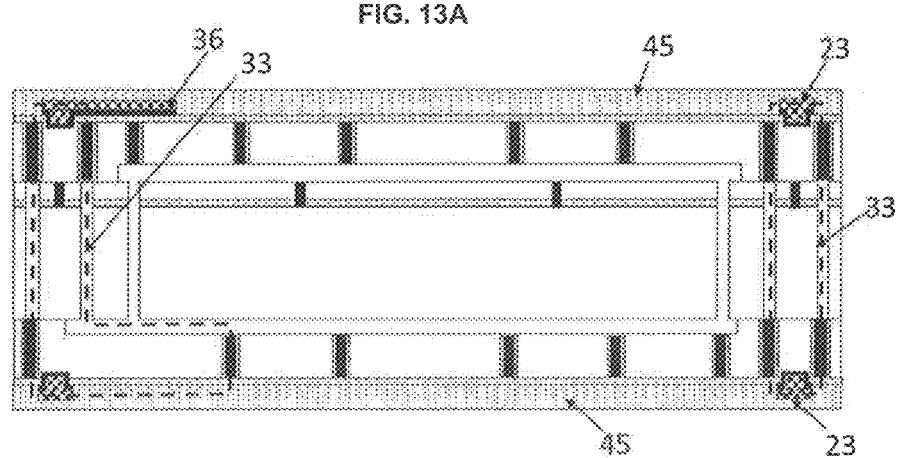
FIG. 14A is a cross-sectional view of the MEMS device of FIG. 13A, after applying a passivating film over the electrical leads and bond pads.

Referring to FIG. 12A, a metallic layer 41 is applied on the cap insulating layer 40. As shown in FIG. 13A, the metallic layer 41 is then patterned to form electrical leads 36 and bond pads 23. Finally, as shown in FIG. 14A, a passivating film 45 is applied over the electrical leads 36 and the bond pads 23. The passivating film protects electrical leads 36 which can extend along the top surface of the cap wafers. At this point, if electrical contacts are desired in the bottom cap, the process steps shown in FIGS. 11 through 14 can be repeated on the bottom wafer as further shown in FIG. 14A. As shown in FIG. 15A, openings are then created in the passivating film 45 over the bond pads 23. In this way, the insulated conducting pathways 33 from the top, sides, and bottom of the MEMS device are accessible from at least the top cap wafer 12 for wire bonding, flip-chip bonding, or wafer bonding.

Because the bond pads 23 are on the first or top side of the MEMS device, the described 3DTCV architecture provides the packaging flexibility of a 2D chip (such as comb-sensors) for 3D MEMS devices (such as including large proof masses) and is compatible with CMOS circuitry. The MEMS device 10 can for example be mounted side-by-side with, and wire bonded to, the sensing IC.

Referring to FIG. 16A, the IC 44 can be stacked on top of the MEMS device 10 and wire bonded to it. Alternatively, as shown in FIG. 16B, depending upon the relative sizes of the IC 44 and MEMS device 10, the MEMS device 10 can be mounted atop the IC 44 and wire bonded.

Figure 17:
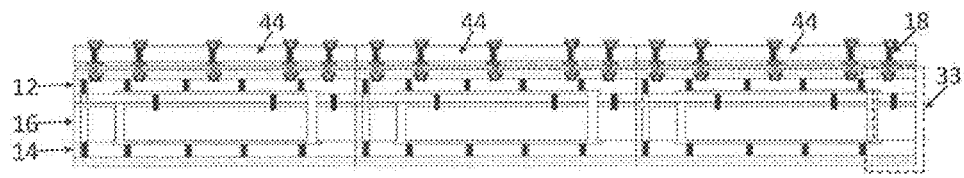
FIG. 17 is cross-sectional view of a top cap wafer of MEMS devices bonded to a CMOS wafer, prior to dicing, the CMOS containing TSVs electrically connected to insulated conducting pathways of the MEMS device via the electrical contacts of the top cap wafer.
Figure 18:
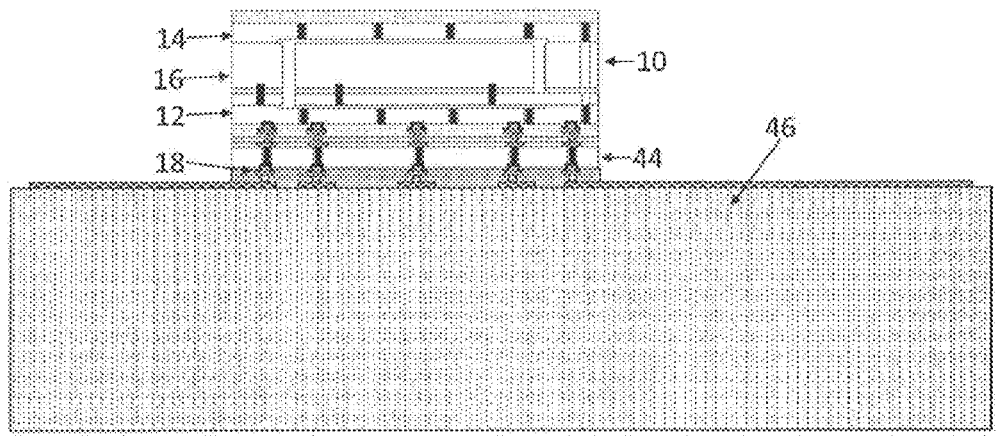
FIG. 18 is a cross-sectional view of a MEMS device, of an IC chip and of a PCB, the IC chip being bonded on the top cap wafer of the MEMS device, the IC chip being flip-chip bonded to a PCB without wire bonding, the CMOS including TSVs allowing to route signals from the PCB to the MEMS device.
Figure 19:
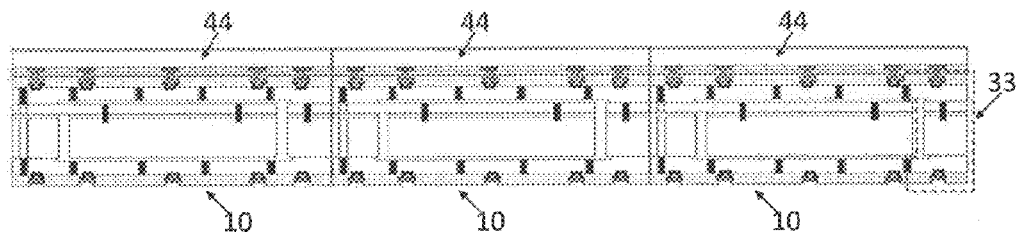
FIG. 19 is cross-sectional view of a top cap wafer of MEMS devices bonded to a CMOS wafer, prior to dicing, the MEMS device comprising insulated conducting pathways extending from the bottom cap wafer to the top cap wafer, the pathways being electrically connected to the CMOS wafer.

Preferably, as shown in FIG. 16C, the MEMS device 10 is mated with a custom IC 44 of matching size and bond pad layout. This enables flip-chip bonding of the MEMS 10 and IC 44 either at the chip-level, as shown in FIG. 16C, or more advantageously at the wafer-level, as shown in FIGS. 17 and 19. Referring to FIG. 17, if the MEMS wafer 10 does not include bottom side contacts, it can be bump-bonded at the wafer level to an IC wafer 44 with TSVs. TSV technology has been developed for CMOS to enable multi-level CMOS chip bonding developed for imagers and multi-chip memory. The insulated conducting pathways of the MEMS wafer 33 can thus be directly connected to TSVs 18 of the CMOS IC wafer 44, as shown in FIG. 17. The bonded MEMS wafer 10 and CMOS wafer with TSVs 44 can then be diced, thereby producing hermetically sealed chips. The CMOS TSVs 18 can be directly flip-chip bonded through to a PCB without any wire bonding as shown in FIG. 18.

Figure 20:
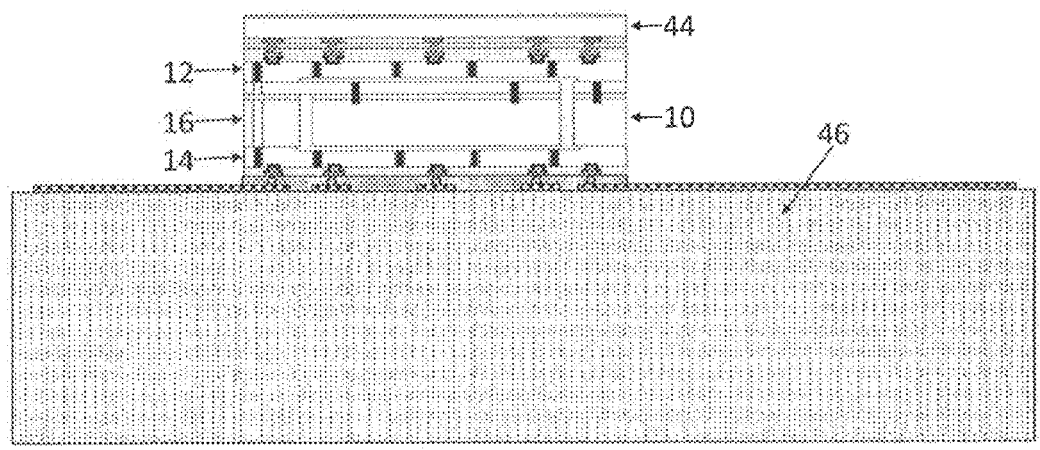
FIG. 20 is a cross-sectional view of an IC chip, of a MEMS device and of a PCB, the IC chip being bonded on the top cap wafer of the MEMS device, the bottom cap wafer of the MEMS device being bonded to a PCB without wire bonding, the MEMS device including insulated conducting pathways allowing to route signals from the PCB to the IC chip via the MEMS device pathways.

Alternatively, as shown in FIG. 19, if electrical contacts have been included on both the top and bottom caps of the MEMS device, the insulated conducting pathway 33, such as a device feedthrough, can be used to route signals from an IC wafer 44 without TSVs through the MEMS device 10. The pathway 33 is thus used as a 3DTCV, which extends from the top to the bottom caps of the MEMS device 10. As shown in FIG. 20, the 3DTCV enable flip-chip bonding of the MEMS/IC stack to a PCB 46 without the use of CMOS TSVs. Some of the pathways, or 3DTCVs, in the MEMS device can be used to feed the CMOS output back through the MEMS chip. Bond pad openings can be made in the bottom cap passivation and bump bonds patterned on the bottom of the MEMS device (the side opposite the CMOS). In this approach the MEMS device instead of the CMOS is then flip-chip bonded to the PCB, as shown in FIG. 20.

The figures illustrate only an exemplary embodiment of the invention and are, therefore, not to be considered limiting of its scope, for the invention may admit to other equally effective or equivalent embodiments. The scope of the claims should not be limited by the preferred embodiments set forth in the examples, but should be given the broadest interpretation consistent with the description as a whole.

The invention claimed is:

1. A three dimensional (3D) MEMS device comprising:
   an electrically conductive MEMS wafer including a MEMS structure, the MEMS wafer having a first side and a second side;
   an electrically conductive top cap wafer having an inner top cap side and an outer top cap side, the inner top cap side being bonded to the first side of the MEMS wafer, the outer top cap side having electrical contacts on or over the electrically conductive top cap wafer;
   an electrically conductive bottom cap wafer having an inner bottom cap side and an outer bottom cap side, the inner bottom cap side being bonded to the second side of the MEMS wafer such that the MEMS wafer, the top cap wafer and the bottom cap wafer define a cavity for housing the MEMS structure; and
   insulated conducting pathways extending from the bottom cap wafer, through the MEMS wafer and through the top cap wafer, to the electrical contacts such that the insulated conducting pathways are operative to conduct electrical signals from portions of the insulated conductive pathways that extend within the bottom cap wafer to the electrical contacts on or over the top cap wafer.

2. The 3D MEMS device according to claim 1, wherein at least one of the insulated conducting pathways comprises a portion formed by a channel extending through the entire thickness of at least the corresponding top cap wafer or the MEMS wafer or the bottom cap wafer.

3. The 3D MEMS device according to claim 2, wherein the channel has a sidewall coated with an insulating material, the inside of the channel being filled with a conducting material.

4. The 3 D MEMS device according to claim 1, wherein at least one of the insulated conducting pathways comprises a portion formed by a trench surrounding a conductive wafer plug.

5. The 3D MEMS device according to claim 4, wherein the trench is filled with an insulating material.

6. The 3D MEMS device according to claim 1, wherein said insulated conducting pathways each comprises a top cap wafer channel, a MEMS wafer channel and a bottom cap wafer channel, said channels being aligned at a first wafer interfaces between the top cap wafer and the MEMS wafer and a second wafer interface between the MEMS wafer and the bottom cap wafer.

7. The 3D MEMS device according to claim 6, wherein for at least one of the insulated conducting pathways, the top cap wafer channel and the bottom cap wafer channel respectively comprises a through silicon via (TSV).

8. The 3D MEMS device according to claim 1, wherein at least one of the electrical contacts on the top cap wafer is connectable to an external potential, the corresponding insulated conducting pathway being a case pathway located at the periphery of the device.

9. The 3D MEMS device according to claim 1, wherein the outer bottom cap side of the bottom cap wafer has electrical contacts, at least one of the insulated conducting pathways being a device feedthrough extending from one of the electrical contacts on the top cap wafer to one of the electrical contacts on the bottom cap wafer.

10. The 3D MEMS device according to claim 1, wherein the bottom cap wafer comprises bottom cap electrodes, some of the insulated conducting pathways being respectively connected to the bottom cap electrodes, for transmitting electrical signals between the bottom cap electrodes and corresponding electrical contacts on the top cap wafer.

11. The 3D MEMS device according to claim 1, comprising at least one additional insulated conducting pathway extending through the MEMS wafer and through the top cap wafer, said at least one additional insulated conducting pathway connecting the MEMS structure to one of the electrical contacts on the top cap wafer such that the at least one additional insulated conducting pathway transmits electrical signals between the MEMS structure and said one electrical contact.

12. The 3D MEMS device according to claim 1, wherein the MEMS wafer is a silicon-on-insulator (SOI) wafer with an insulating layer separating a device layer from a handle layer, the insulated conducting pathways comprising respective SOI conducting shunts, electrically connecting the device and handle layers.

13. The 3D MEMS device according to claim 12, wherein the MEMS structure is patterned in both the device layer and the handle layer.

14. The 3D MEMS device according to claim 1, wherein the top cap wafer comprises top cap electrodes, the MEMS device comprising other additional insulated conducting pathways respectively extending through the top cap wafer between said top cap electrodes and corresponding electrical contacts on the top cap wafer, for transmitting electrical signals between the top cap electrodes and the corresponding electrical contacts on the top cap wafer.

15. The 3D MEMS device according claim 1, comprising a cap insulating layer deposited on at least one of the outer top cap side of the top cap wafer and the outer bottom cap side of the bottom cap wafer.

16. The 3D MEMS device according to claim 1, wherein the top cap wafer, the MEMS wafer and the bottom cap wafer are made of a silicon semiconductor and wherein the top cap wafer, the MEMS wafer and optionally, the bottom cap wafer are bonded with a conductive bond.

17. The 3D MEMS device according to claim 1, wherein the cavity is hermetically sealed and wherein the cavity is under vacuum or contains fluid.

18. A method for manufacturing a three dimensional MEMS device, the method comprising the steps of:
   forming insulated conducting cap wafer channels on an inner side of a first cap wafer and on an inner side of a second cap wafer;
   patterning first portions of a MEMS structure and portions of insulated conducting MEMS wafer channels in a first side of a MEMS wafer;
   bonding said first side of the patterned MEMS wafer to the inner side of the first cap wafer by aligning the insulated conducting cap wafer channels of said first cap wafer with the portions of the insulated conducting MEMS wafer channels;

patterning second portions of the MEMS structure and further portions of the insulated conducting MEMS wafer channels on a second side of the MEMS wafer;

further bonding the second side of the patterned MEMS wafer to the inner side of the second cap wafer, by aligning such that the insulated conducting cap wafer channels of said second cap wafer are aligned with the further portions of the insulated conducting MEMS wafer channels, thereby forming insulated conducting pathways extending from within the second cap wafer, through the MEMS wafer and through the first cap wafer; and removing a portion of the an outer sides side of the first cap wafer and a portion of an outer side of the second cap wafer to expose the insulated conducting pathways.

19. The method for manufacturing the three dimensional MEMS device according to claim 18, wherein the forming step comprises patterning trenches on the inner sides of the first cap wafer and the second cap wafer, the trenches extending only partially through the first cap wafer and second cap wafer; and filling the trenches with an insulating material.

20. The method for manufacturing the three dimensional MEMS device according to claim 18, wherein the forming step comprises patterning a recess in the first cap wafer that comprises a top cap wafer to form part of a cavity for housing the MEMS structure.

21. The method for manufacturing the three dimensional MEMS device according to claim 18, wherein the forming step comprises patterning trenches on the first cap wafer and the second cap wafer and filling the trenches for forming to form cap wafer electrodes and/or leads.

22. The method for manufacturing the three dimensional MEMS device according to claim 18, the MEMS wafer being an a silicon-on-insulator (SOI) wafer with an insulating layer separating a device layer from a handle layer, wherein the patterning first portions step comprises forming SOI conducting shunts through the device layer and the insulating layer, and further comprising etching trenches surrounding some one or more of the SOI conducting shunts, for forming said further portions of the insulated conducting MEMS wafer channels.

23. The method for manufacturing the three dimensional MEMS device according to claim 18, wherein the patterning first portions step comprises etching trenches on the first side of the MEMS wafer for forming MEMS electrodes and/or leads.

24. The method for manufacturing the three dimensional MEMS device according to claim 18, wherein the bonding step comprises bonding a top cap wafer to the first side of the MEMS wafer with a conductive bond and wherein the further bonding step comprises bonding a bottom cap wafer to the second side of the MEMS wafer with a conductive bond, the conductive bond comprising a bonding layer or a fusion bond.

25. The method for manufacturing the three dimensional MEMS device according to claim 18, wherein the patterning second portions step comprises etching trenches on the second side of the MEMS wafer to form a further portion of the MEMS structure and to form conductive wafer plugs part of the insulated conducting MEMS wafer channels.

26. The method for manufacturing the three dimensional MEMS device according to claim 18, wherein the removing step comprises grinding and polishing the outer sides of the first cap wafer comprising a top cap wafer and the second cap wafer comprising a bottom cap wafer and wherein the removing step comprises electrically passivating the outer sides of the top cap wafer and the bottom cap wafer with cap insulating layers.

27. The method for manufacturing the three dimensional MEMS device according to claim 18, further comprising forming electrical contacts on the outer side of the first cap wafer comprising a top cap wafer connected with the insulated conducting pathways, such that the insulated conducting pathways conduct electrical signals from the second cap wafer comprising a bottom cap wafer to said electrical contacts on the top cap wafer.

28. The method for manufacturing the three dimensional MEMS device according to claim 27, wherein the electrical contacts forming step further comprises forming electrical contacts on an outer side of the bottom cap wafer connected to one or more of the insulated conducting pathways, allowing routing of electrical signals to the electrical contacts on the bottom cap wafer.

29. The method for manufacturing the three dimensional MEMS device according to claim 28, wherein the electrical contacts forming step comprises forming openings in the a cap insulating layer on an outer side of the top cap wafer and/or the bottom cap wafer, said openings being in line with the insulated conducting cap wafer channels; applying a metallic layer on said cap insulating layer and patterning the metallic layer to form electrical leads and bond pads; and applying a passivating film over the electrical leads and the bond pads, and forming openings in said passivating film over the bond pads.

30. A three dimensional (3D) MEMS device comprising:
an electrically conductive MEMS wafer including a MEMS structure, the MEMS wafer having a first side and a second side;
an electrically conductive top cap wafer having an inner top cap side and an outer top cap side, the inner top cap side being bonded to the first side of the MEMS wafer, the outer top cap side having electrical contacts;
an electrically conductive bottom cap wafer having an inner bottom cap side and an outer bottom cap side, the inner bottom cap side being bonded to the second side of the MEMS wafer such that the MEMS wafer, the top cap wafer and the bottom cap wafer define a cavity for housing the MEMS structure; and
insulated conducting pathways extending from the bottom cap wafer, through the MEMS wafer and through the top cap wafer, to respective electrical contacts such that the insulated conducting pathways are operative to conduct electrical signals from portions of the insulated conducting pathways extending from within the bottom cap wafer to the electrical contacts on the top cap wafer, wherein at least one of said insulated conducting pathways comprises a top cap wafer channel, a MEMS wafer channel and a bottom cap wafer channel, said channels being aligned at a first wafer interface between the top cap wafer and the MEMS wafer and a second wafer interface between the MEMS wafer and the bottom cap wafer.

* * * * *